(12) United States Patent
Langa et al.

(10) Patent No.: US 10,483,876 B2
(45) Date of Patent: Nov. 19, 2019

(54) ELECTROSTATICALLY DEFLECTABLE MICROMECHANICAL DEVICE

(71) Applicant: Fraunhofer-Gesellschaft zur Foerderung der angewandten Forschung e.V., Munich (DE)

(72) Inventors: Sergiu Langa, Dresden (DE); Holger Conrad, Dresden (DE); Harald Schenk, Dresden (DE); Michael Stolz, Cottbus (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 683 days.

(21) Appl. No.: 14/968,635

(22) Filed: Dec. 14, 2015

(65) Prior Publication Data

US 2016/0173001 A1    Jun. 16, 2016

(51) Int. Cl.
| | |
|---|---|
| *H02N 1/08* | (2006.01) |
| *H02N 1/00* | (2006.01) |
| *B81B 3/00* | (2006.01) |
| *H02N 1/06* | (2006.01) |

(52) U.S. Cl.
CPC ............ *H02N 1/006* (2013.01); *B81B 3/0021* (2013.01); *B81B 2201/032* (2013.01); *B81B 2203/0118* (2013.01); *B81B 2203/0127* (2013.01)

(58) Field of Classification Search
CPC .......... H02N 1/006; H02N 1/002; H02N 1/06; H02N 1/08; B81B 7/02; B81B 3/0021; B81B 3/0018; B81B 2201/032; B81B 2203/0109; B81B 2203/0118; B81B 2203/0127; H01H 1/00
See application file for complete search history.

(56) References Cited

U.S. PATENT DOCUMENTS

| | | | |
|---|---|---|---|
| 5,471,721 A | 12/1995 | Haertling | |
| 5,867,302 A * | 2/1999 | Fleming | ............... B81B 3/0054 310/328 |
| 6,229,684 B1 * | 5/2001 | Cowen | ..................... F03G 7/06 361/277 |

(Continued)

FOREIGN PATENT DOCUMENTS

| | | |
|---|---|---|
| EP | 1832550 A1 | 9/2007 |
| WO | 2012095185 A1 | 7/2012 |

*Primary Examiner* — Edgardo San Martin
(74) *Attorney, Agent, or Firm* — Haynes and Boone, LLP

(57) ABSTRACT

A micromechanical device with electrostatically caused deflection by a plate capacitor extending along and spaced apart from the neutral fiber of the deflectable element is improved with regard to its manufacturing complexity and/or with regard to its operating characteristics, such as, for example, maximum voltage applicable or deflectability, by using a continuous insulation layer between the distal and proximal electrodes of the plate capacitor, or else the proximal electrode is structured so as to have gaps at the segment boundaries where the distal electrode is mechanically fixed so as to be laterally spaced apart from the distal electrode. Both procedures avoid the problems of generating a roughness of the surface of the proximal electrode facing the distal electrode, as would otherwise be necessitated by etching an insulation layer for providing spacers between the distal and proximal electrodes at the segment boundaries.

33 Claims, 21 Drawing Sheets

(56) References Cited

U.S. PATENT DOCUMENTS

| | | | | |
|---|---|---|---|---|
| 6,720,851 B2* | 4/2004 | Hallbjorner | ........ | H01H 59/0009 200/181 |
| 7,196,599 B2* | 3/2007 | Dabbaj | ................ | H02N 1/006 200/181 |
| 8,796,901 B2* | 8/2014 | Huang | ................ | B06B 1/0292 310/309 |
| 8,926,517 B2* | 1/2015 | Huang | ................ | B06B 1/0292 367/140 |
| 8,975,984 B2* | 3/2015 | Huang | ................ | H03H 3/0072 333/186 |
| 9,164,277 B2* | 10/2015 | Conrad | ............. | G02B 26/0841 |
| 9,676,607 B2* | 6/2017 | Gaudet | ................ | B81B 3/0021 |
| 9,676,616 B2* | 6/2017 | Sato | ................ | B81C 1/00182 |
| 9,821,340 B2* | 11/2017 | Zhuang | ................ | B06B 1/0292 |
| 9,828,237 B2* | 11/2017 | Walther | ................ | H04R 19/005 |
| 10,029,912 B2* | 7/2018 | Huang | ................ | H03H 3/0072 |
| 2004/0056742 A1 | 3/2004 | Dabbaj | | |
| 2007/0247018 A1* | 10/2007 | Flores | ................ | B81B 3/0018 310/309 |
| 2018/0085785 A1* | 3/2018 | Zhuang | ................ | B06B 1/0292 |

* cited by examiner

ELECTROSTATICALLY DEFLECTABLE MICROMECHANICAL DEVICE

CROSS-REFERENCE TO RELATED APPLICATION

This application claims priority from German Application No. 10 2014 225 934.7, filed Dec. 15, 2014, and is incorporated herein by reference in its entirety.

BACKGROUND OF THE INVENTION

The present application relates to an electrostatically deflectable micromechanical device or a device comprising an electrostatically operating actuator for deflecting the mechanical device by means of a principle similar to the bimorph deflection principle.

Micromechanical devices comprising deflectable elements, such as, for example, beams or cantilevers, or plates or membranes, are employed in a plurality of technical fields, such as, for example, for beam deflection in projectors or SLM (Spatial Light Modulators), only to name a single representative example.

The electrostatic attractive force is used primarily as the drive principle for deflection in micro or nano actuators. The deflectable element and a fixed element are provided with a differing potential so as to cause a deflection by the electrostatic attractive force between same. The force here is indirectly proportional to the square of the distance between the deflectable element functioning as the first electrode and the fixed electrode. Due to this connection, the result, when a certain potential difference is exceeded, is a so-called "pull-in effect" where the deflectable element is accelerated towards the fixed electrode and touches same. For this reason, when using an electrostatic drive by means of a rigid electrode, a sufficient distance between the deflectable element and the rigid electrode is to be kept in mind, which in turn necessitates using high voltages in order to provide a compensation for the fact that the electrostatic force will be smaller due to the increased distance. Voltages of 100 volts or more are nothing unusual, which in turn causes further problems.

Apart from that, there are bimorph deflectable structures. Thermo-mechanical bimorph structures, for example, make use of the differing expansion of different materials by locating heating structures so as to make use of the bimorph principle for deflection. However, the response times here are low, the temperature differences necessitated for big deflections are high and the selection of materials naturally is limited, all these being disadvantages for a realization thereof. Another bimorph principle uses piezoelectric or electrostrictive elements in order to deflect a deflectable element in a bimorph way. Handling the materials necessitated here is a problem, since these make integration into conventional semiconductor manufacturing processes impossible. All in all, producing such drive structures is complicated and expensive.

One approach for solving these problems is presented in WO2012095185A1. FIG. 21 shows a micromechanical device which is described there. A deflection similar to the bimorph principle here is achieved by generating, spaced apart from the neutral fiber of the deflectable element, a transverse contraction or transverse expansion in a lateral direction by means of the electrostatic attractive force, which in turn curves the deflectable element. FIG. 21 shows the micromechanical device in cross-section. The micromechanical device of FIG. 21 comprises a deflectable element 10 which is formed in the shape of a beam or a membrane. The cross-section here is taken in the direction of thickness. In particular, the deflectable element 10 comprises a beam or membrane 20 through which the neutral fiber 16 of the deflectable element 10 extends, wherein a plate capacitor 14 is formed on one side of the beam or membrane 20 that is spaced apart from the neutral fiber 16. A proximal electrode of the capacitor 14 is formed by the beam or the membrane 20 itself. A distal electrode 18 of the plate capacitor 14 is opposite the beam or membrane 20. Thus, the plate capacitor 14 is divided, in a lateral direction 12, into segments 22 between which the distal electrode 18 and the proximal electrode 20 are connected mechanically between the segments 22 at segment boundaries 24. Both electrodes 20 and 18 are implemented to be laterally continuous. When providing the plate capacitor 14 with a voltage, the electrostatic attractive force between the electrodes 18 and 20 causes a transverse expansion which causes the deflectable element 10 to be deflected along the direction 12 such that the neutral fiber 16 is curved stronger than the plate capacitor 14. Compared to the electrostatic actuators having been described above, a principle similar to the bimorph principle is made use of in accordance with FIG. 21. The electrodes 20 and 18 are essentially rigid. Expressed differently, no bending of one or both electrodes 18, 20 per segment is to be achieved, which bends would then be passed on from segment to segment, but the expansion in the distance of the capacitor 14 from the neutral fiber 16 causes curving in accordance with the bimorph principle. This means that problems, such as, for example, the pull-in effect, are not to be expected. This in turn allows the distance between the electrodes 18 and 20 to be implemented to be enormously small and, consequently, connected thereto the electrostatic attractive forces to be enormous in order to generate a sufficient transverse expansion. What is more, due to the principle of deflection discussed above, which is similar to the bimorph principle, the deflectable element 10 may be and is to be bend-proof. For this reason, transmission of forces and high stability to externally caused movements are possible using the micromechanical device of FIG. 21.

However, a problem when manufacturing the micromechanical devices presented in the above WO document is realizing the plate capacitor 14. As is shown in FIG. 21, the electrodes 18 and 20 are electrically insulated from each other by portions 26 of an insulation layer which are arranged at the segment boundaries 24 and provide for both the mutual electrical insulation and the mechanical connection mentioned before. In other words, the portions 26 form insulating spacers which are arranged vertically or in a direction of thickness between the electrodes 18 and 20. The structuring of this insulation layer, which in FIG. 21 is illustrated in a hatched manner, causes problems when manufacturing the micromechanical device of FIG. 21. While the top electrode 18 and that side of the beam or membrane 20 facing the top electrode 18 may comprise a topography in the micrometer scale, the mutually facing surface thereof is, as regards roughness, definitely to be smooth, that is on the nanometer scale, since deviations from this smoothness result in electrical voltage peaks and breakthroughs, that is limit the voltage applicable and, thus, the lifetime or deflection achievable. However, achieving smoothness is a problem for the following reasons. When manufacturing, the gaps 28 between the spacers 26 or voids 28 of the segments 22 between the electrodes 18 and 20 are filled with a sacrificial material which has to be removed again after applying the electrode 18. The material from which the spacers 26 are made, thus needs to be inert relative to etching of the sacrificial material in these gaps 28, since otherwise the insulation islands or spacers 26 would be attacked or even removed when etching the sacrificial layer. The structuring of the insulation islands 26 causes the greatest difficulty when manufacturing the micromechanical device in accordance with claim 21. The material of the insulation island may, for example, be silicon oxide, silicon nitride or aluminum oxide. Such materials are mainly structured using dry etching, such as, for example, reactive ion etching (RIE). Wet etching by means of an etching liquid would be possible in principle, but provides a poorer lateral resolution, since etching is isotropic, which means that the mask here is under-etched. Thus, dry etching is an advantageous type of structuring for the insulation layer between the electrodes 18 and 20. In order to be able to check on the dry etching in the depth well, a so-called "etch stop layer" which is to be placed underneath the layer to be etched, that is here the sacrificial material at the positions 28, is usually necessitated. As is shown in FIG. 21, the bottom electrode 20, that is the beam or membrane 20, is located here at these positions 28. However, the bottom electrode 20 is poorly suitable as an etch stop layer for structuring the insulation layer, since dry etching tends to etch on the bottom electrodes in a more than insignificant manner, which in turn increases the roughness of that side of the bending beam or membrane 20 facing the top electrode 18. As has already been mentioned, the bottom electrode 20 or beam/membrane 20 is to be smooth on the nanometer scale on that surface facing the top electrode 18. This means that it is not possible easily to structure the insulation islands 26 using dry etching and an etch stop on the bottom electrode 20 such that the surface of the bottom electrode 20, after etching, exhibits the desired very small roughness. Additionally, in order to achieve a maximum deflection effect, a topography of the bottom and top electrodes 18, 20 of the plate capacitor 14 is desired, such as, for example, a V-shaped cross-section, segment by segment, of the gap 28 between the electrodes 18 and 20 with a corresponding V-shaped topography of that side of the beam or membrane 20 facing the top electrode 18. However, such topographies are difficult to manufacture. If a desired topography on that side of the beam or membrane 20 facing the top electrode 18 is produced, the following technological steps are influenced strongly by this topography and, in dependence of this topography, are to be optimized differently than would be the case with a completely planar implementation of the plate capacitor 14, as is illustrated in FIG. 21 for reasons of simplicity. Structuring the insulation layer so as to generate the insulation islands 26 is, in particular, among these subsequent steps. However, this deteriorates the situation when generating the insulation islands further.

Consequently, the object of the present invention is providing a micromechanical device comprising an electrostatic deflection principle and the advantages of a bimorph deflection or a deflection similar to the bimorph deflection, which additionally may be manufactured more easily and/or exhibit an improved operating behavior.

SUMMARY

An embodiment may have a micromechanical device having a deflectable element, wherein the deflectable element has an electrostatic actuator which is implemented as a plate capacitor extending along and spaced apart in a deflection direction from a neutral fiber of the deflectable element, the capacitor having a distal electrode and a proximal electrode, wherein the proximal electrode is arranged between the distal electrode and the neutral fiber and the plate capacitor is subdivided along a direction into segments between which the distal electrode is fixed mechanically at segment boundaries such that the deflectable element, by providing the plate capacitor with a voltage, is deflected along the direction in or opposite to the deflection direction, wherein the proximal electrode is arranged at a side of an insulation material of the deflectable element facing the distal electrode and is structured along the direction so as to have gaps at the segment boundaries such that the distal electrode is mounted mechanically to the insulation material at the segment boundaries in a manner laterally spaced apart from the proximal electrode.

Another embodiment may have a micromechanical device having a deflectable element, wherein the deflectable element has an electrostatic actuator which is implemented as a plate capacitor extending along and spaced apart in a direction of deflection from a neutral fiber of the delectable element, the capacitor having a distal and a proximal electrode, wherein the distal electrode is arranged on a side of the place capacitor facing away from the neutral fiber and the place capacitor is subdivided along a direction into segments between which the distal electrode and the proximal electrode are connected mechanically at segment boundaries such that, by providing the plate capacitor with a voltage, the deflectable element is deflected along the direction in or opposite to the direction of deflection, wherein an insulation layer extends between the distal electrode and the proximal electrode in a manner formed continuously in the direction across the segments and segment boundaries so as to insulate same from one another such that mechanical coupling at the segment boundary is realized indirectly via the insulation layer.

Another embodiment may have a method for operating a micromechanical device as described above.

According to another embodiment, a method for manufacturing a micromechanical device may have the steps of: providing a beam or membrane functioning as or having a proximal electrode; applying an insulation layer onto the proximal electrode in a manner formed continuously along a segment succession direction; applying sacrificial material onto the insulation layer in a manner structured along the segment succession direction such that the insulation layer is covered by the sacrificial material in segments in the segment succession direction and is exposed in segment boundaries between the segments; applying a distal electrode onto the insulation layer covered segment by segment such that the distal electrode is coupled to the proximal electrode indirectly via the insulation layer such that, by providing a plate capacitor formed by the distal and proximal electrodes with a voltage, the beam or membrane is deflected along the direction transverse to the plate capacitor.

According to another embodiment, a method for manufacturing a micromechanical device may have the steps of: forming a proximal electrode on a surface of an insulation material of a beam or a membrane such that the proximal electrode is structured into portions with gaps therebetween along a segment succession direction; applying sacrificial material onto the surface and the portions in a manner structured along the segment succession direction such that the insulation material is exposed inside the gaps in the segment succession direction and the portions of the proximal electrode are covered by the sacrificial material up to the gaps along the segment succession direction; applying a distal electrode onto the sacrificial material such that the distal electrode is mechanically fixed to the insulation material inside the gaps such that, by providing a plate capacitor formed by the distal and proximal electrodes with a voltage, the beam or membrane is deflected along the direction transverse to the plate capacitor.

The central idea of the present invention is having recognized that a micromechanical device with a deflection similar to the bimorph principle may be improved as regards the manufacturing complexity and/or as regards its operating characteristics, such as, for example, maximum voltage applicable or deflectability, by a plate capacitor extending along and spaced apart from the neutral fiber of the deflectable element when using a continuous insulation layer between the distal and the proximal electrode of the plate capacitor, or structuring the proximal electrode such that it has gaps at the segment boundaries where the distal electrode is fixed mechanically so as to be spaced apart laterally from the distal electrode. Both procedures avoid the problems of generating a roughness of the surface of the bottom electrode facing the distal electrode, as would be necessitated by etching an insulation layer for providing the spacers between the distal and the proximal electrode at the segment boundaries.

BRIEF DESCRIPTION OF THE DRAWINGS

Advantageous implementations of the present application are the subject of the dependent claims and embodiments of the present application will be detailed subsequently referring to the appended drawings, in which:

DETAILED DESCRIPTION OF THE INVENTION

Figure 1:
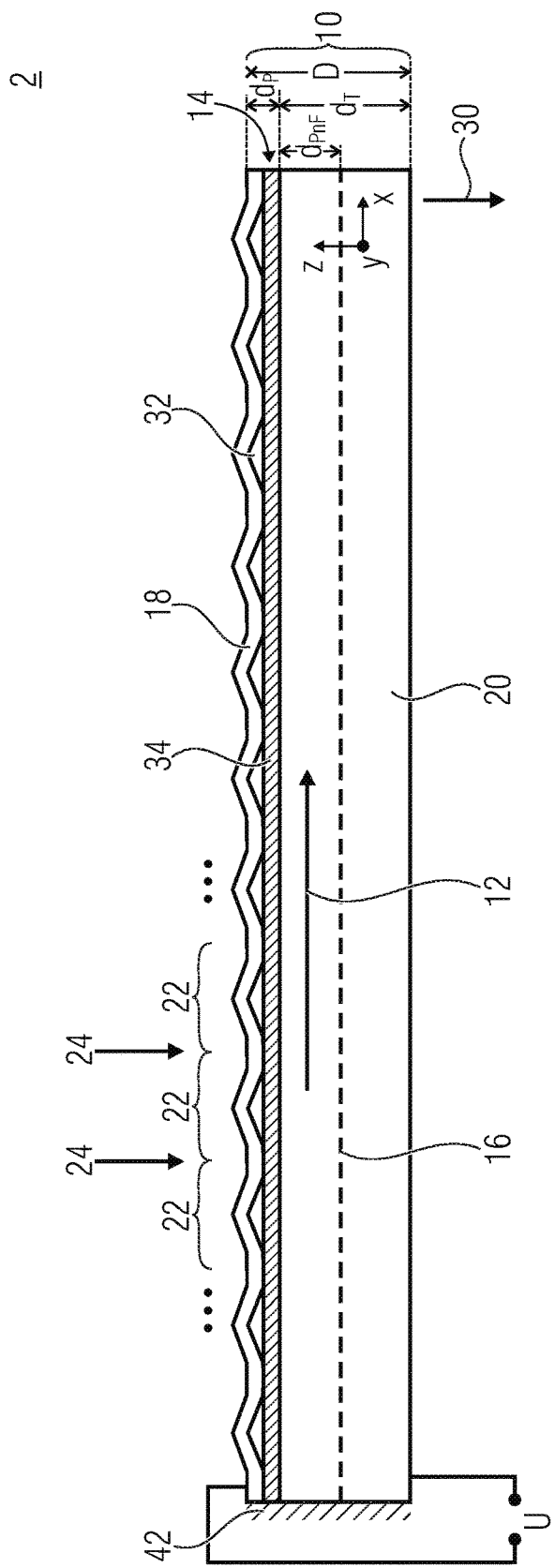
FIG. 1 shows a cross-section of a micromechanical device in accordance with an embodiment in which an insulation layer is arranged continuously between the proximal and distal electrodes in the segment succession direction.

FIG. 1 shows a micromechanical device in accordance with an embodiment of the present application. The micromechanical device which is generally indicated at 2 comprises a deflectable element 10 having an electrostatic actuator which is implemented as a plate capacitor 14 extending along and spaced apart from a neutral fiber 16 of the deflectable element 10, having a distal electrode 18 and a proximal electrode 20, the distal electrode 18 being arranged on a side of the plate capacitor 14 facing away from the neutral fiber 16 and the plate capacitor 14 being divided along a lateral direction 12 into segments 22 between which the distal electrode 18 is fixed mechanically at segment boundaries 24 such that, by providing the plate capacitor 14 with a voltage U, the deflectable element 10 is deflectable along the direction 12 in a manner similar to the bimorph principle, that is, in FIG. 1, in the direction 30 along which the plate capacitor 14 is spaced apart from the neutral fiber 16, that is transverse to the plate capacitor 14.

Put differently, the deflectable element 10 is set up in layers. The layer stack direction is along the direction in which the deflectable element is deflected by applying the voltage U, that is 30 in FIG. 1. As measured in this layer stack direction or thickness direction 30, the plate capacitor 14 advantageously only takes up little space. Exemplary, a distance between the distal side of the proximal electrode 16, i.e. facing away from the neutral fiber 16, and the distal electrode 18 of the plate capacitor 14 at the segment boundaries 24, which in FIG. 1 is referred to as dP, is less than ⅕ or, alternatively, even less than ¹⁄₂₀ of the overall thickness D of the deflectable element 10 measured in the same direction 30. In this way, the distance dPnF between the distal side of the bottom electrode 18 and the neutral fiber 16 is large and, exemplary, is more than 80% of half the thickness D of the deflectable element 10 such that the lateral expansion or lateral tension induced by the plate capacitor 14 in the deflectable element 10, as will be described below in greater detail, having a large lever which roughly corresponds to dPnF, may be used for deflecting the deflectable element 10.

As has already been mentioned, the plate capacitor 14 is divided along the direction 12 into segments 22 between which the electrodes 18 and 20 are mechanically connected to each other at the segment boundaries 24. In each segment 22, the electrodes 18 and 20 are separated from each other via a slot 32. The slot 32 may be an air gap or an enclosed cavity, as will be discussed below, or the slot 32 may be filled with a fluid or with a different material which, compared to the other materials of a deflectable element 10, is soft.

In accordance with the embodiment of FIG. 1, the proximal electrode 18 and the distal electrode 20 are formed in the direction 12 to be continuous over the segments 22 and segment boundaries 24, that is they do not exhibit any recesses or gaps. As has been described, the electrodes 18 and 20 are connected to each other mechanically at the segment boundaries 24. In order to insulate same from each other electrically at these locations or boundaries 24, an insulation layer 34 is provided between the distal electrode 18 and the proximal electrode 20 in a manner continuous in the direction 12 over the segments 22 and segment boundaries 24. As will become clear from the following discussion of an embodiment for manufacturing a micromechanical device 2 in accordance with FIG. 1, the continuous insulation layer 34 allows maintaining smoothness of the side of the proximal electrode 20 facing the distal electrode 18. This means that the insulation layer 34 protects this distal side of the proximal electrode 20 from production processes performed afterwards, for example for generating the distal electrode 18. In this way, voltage peaks caused by the roughness of the distal side of the proximal electrode 20 may be prevented, that is the voltage U may be selected to be higher, since voltage peaks can be suppressed better. This in turn allows a larger deflection of the element 10 in the direction 30.

Different variations with regard to which the embodiment of FIG. 1 may be varied are to be pointed out below, or different manners in which the embodiment of FIG. 1 may be realized.

Figure 2:
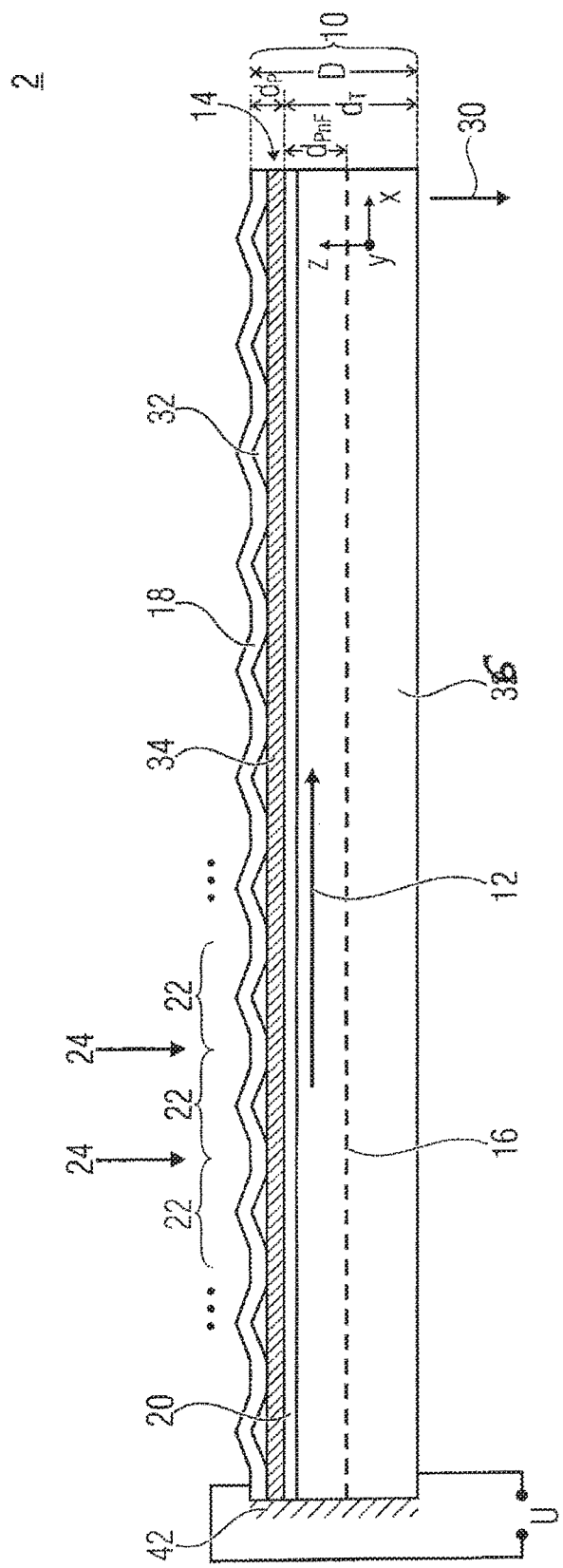
FIG. 2 shows a cross-sectional view of a micromechanical device in which, in contrast to the illustration of FIG. 1, the proximal electrode is not formed by the beam/membrane, but by a layer provided specifically thereon.

FIG. 1 exemplary shows a way according to which the proximal electrode 20 at the same time is the gross, that is the majority volume portion of the deflectable element 10, such as, for example, a volume portion larger than 90%. Put in other words, the deflectable element 10 of FIG. 1 has a beam or a membrane as a carrier through which the neutral fiber 16 passes, wherein this support abuts directly on the insulation layer 34 at its side facing the distal electrode 18 so as to finally serve itself as the proximal electrode 20. However, things may be different. FIG. 2 exemplary shows an embodiment of a micromechanical device, modified compared to FIG. 1, in which the proximal electrode 20 is a separate layer arranged between the insulation layer 34 on the one hand and the actual carrier material 36 on the other hand. While, in the embodiment of FIG. 1, the carrier at the same time serving as the proximal electrode 20 is formed from a conductive material with a thickness dT, the carrier material 36 or the carrier 36 existing as a beam or membrane in FIG. 2 may be electrically conductive, semi-conductive or non-conductive, that is electrically insulating.

Figure 3:
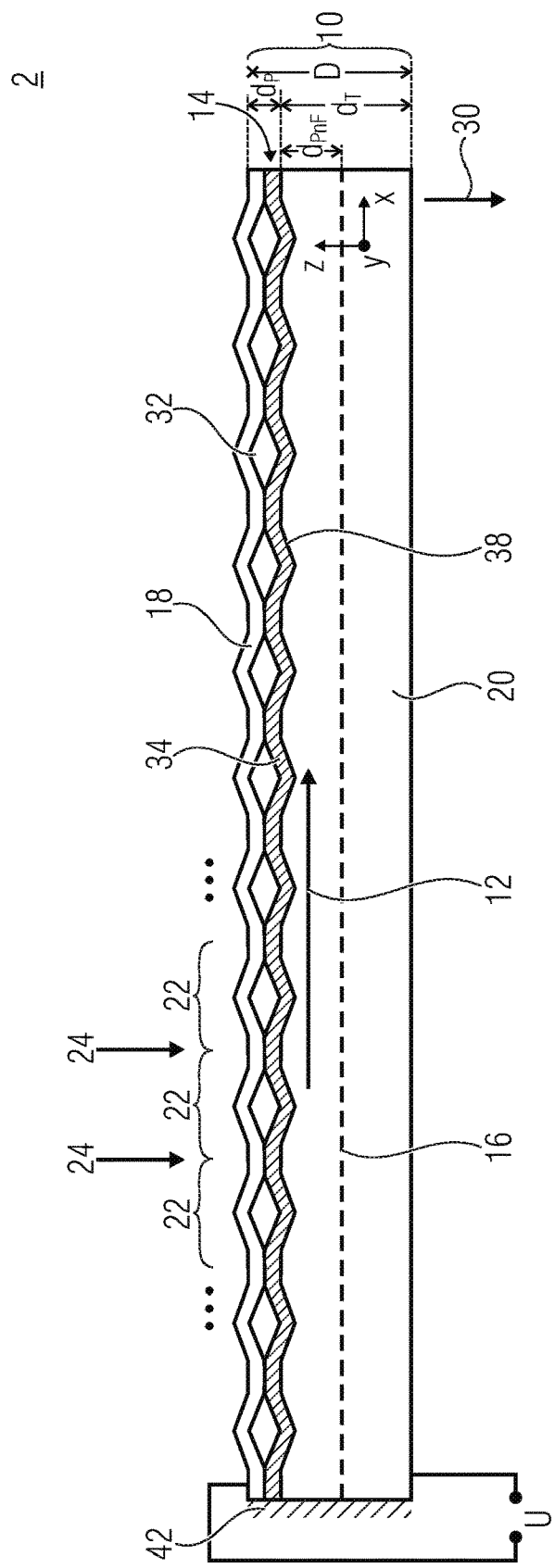
FIG. 3 shows a cross-sectional view of a micromechanical device in which, in contrast to FIG. 1, the proximal electrode comprises a side facing the distal electrode provided with a topography.

In addition, FIG. 1 showed the side of the proximal electrode 20 facing the distal electrode 18 to be implemented to be planar, and additionally the insulation layer 34 as a planar layer abutting thereon, wherein the slot 32 resulted from a deviation, repeating segment by segment, of the distal electrode 18 from a planar shape extending in parallel to the insulation layer 34. Expressed differently, in FIG. 1, the distal electrode 18 has an essentially constant thickness and abuts only on the insulation layer 34 at the segment boundaries 24 to be mechanically mounted thereto, and otherwise is distant from the insulation layer 34 via the slot 32. However, there are also alternatives. FIG. 3, for example, shows that the slot 32 for each segment 22 has a cross-section, that is a cross-section in parallel to the segment succession direction 12 and in parallel to the thickness or layer stack direction 30, which is not linear neither on its side abutting on the distal electrode 18 nor on the side facing the proximal electrode 20. In FIG. 3, for example, the slots 32 exhibit a convex or non-convex cross-section, that is, they protrude or are vaulted towards the two electrodes 18 and 20. In the example of FIG. 3, the topography or deviation of the side of the slot 32 facing the proximal electrode 20 is predetermined by the topography of the side of the proximal electrode 20 facing the distal electrode 18, whereas the insulation layer 34 is implemented to be a conforming layer of basically constant thickness. In other words, in the case of FIG. 3, a recess 38 is provided in each segment 22 on the side of the proximal electrode 20 facing the distal electrode. It is to be kept in mind that the recesses 38 at the segments 22 may also be generated by conformingly depositing the proximal electrode 20 onto a carrier structure 36, in accordance with FIG. 2, provided with corresponding recesses.

Figure 4:
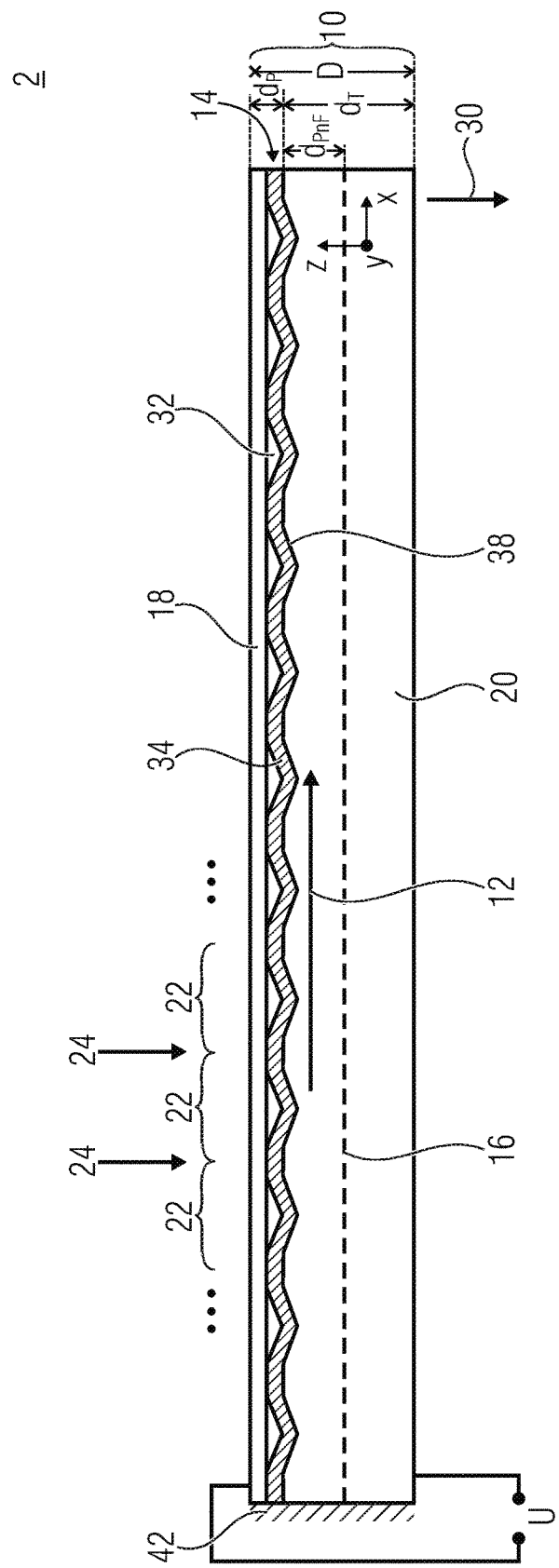
FIG. 4 shows a cross-section of a micromechanical device in accordance with an embodiment in which, in contrast to FIG. 3, the distal electrode is formed to be planar.

However, further variations are also conceivable. FIG. 4, for example, shows that, as a modification of the embodiment of FIG. 3, the distal electrode 18 may also be implemented to be planar to rest on corresponding elevations of the insulation layer 34 at the segment boundaries 34 and be fixed there. The elevations alternate with valleys resulting in the segments 22 along the direction 12 so that in this case the slots 32 in the segments 22 are arching in the direction of the neutral fiber 16, opposite to the case of FIG. 1.

Figure 5:
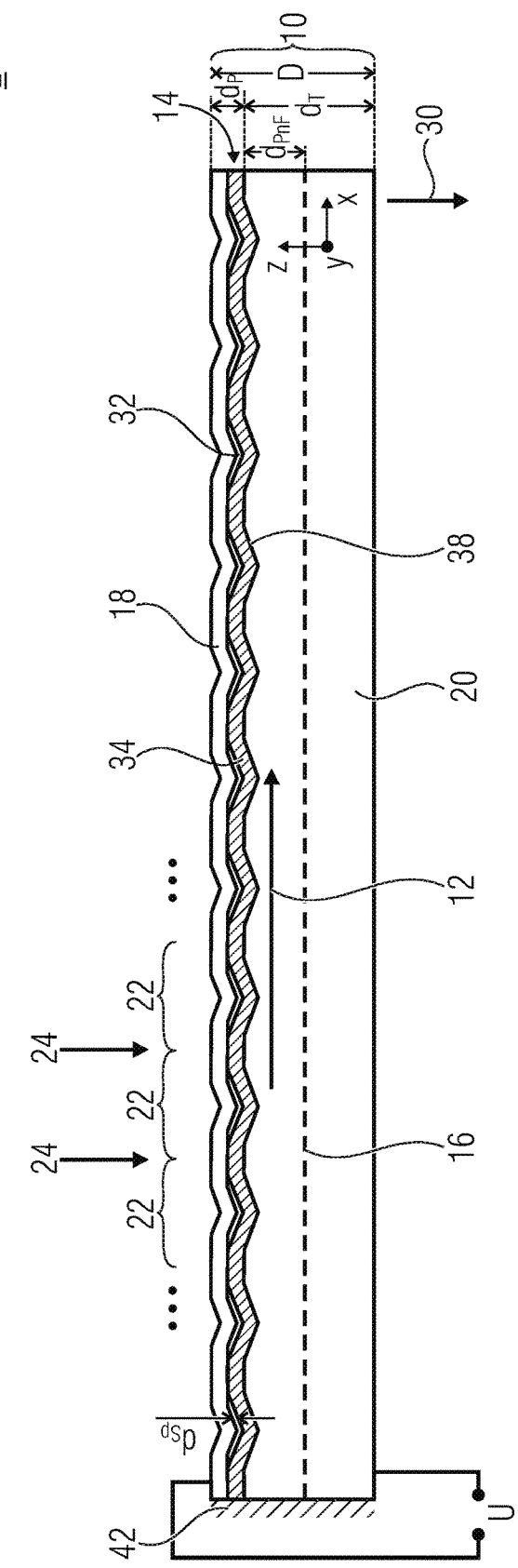
FIG. 5 shows a cross-section of a micromechanical device in accordance with an embodiment in which the gap between the distal and proximal electrodes in the segments comprises an essentially constant thickness in the segment succession direction.
Figure 6:
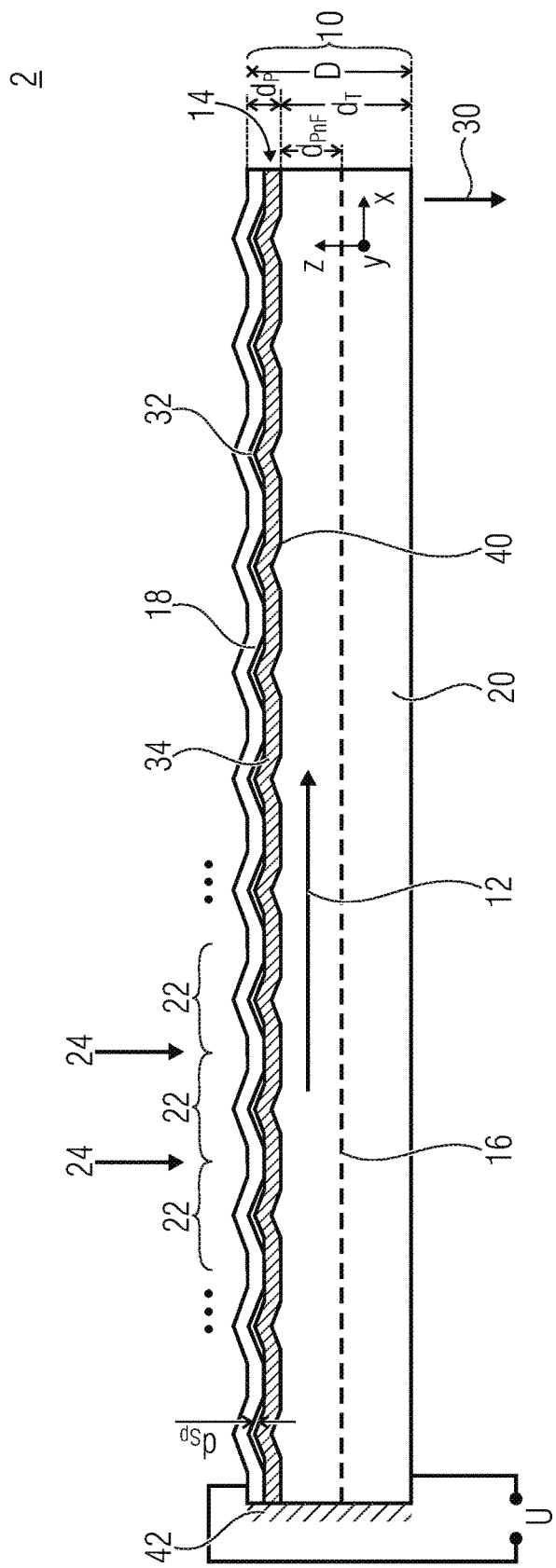
FIG. 6 shows a cross-section of a micromechanical device in accordance with an embodiment in which, in contrast to FIG. 5, the gap is distally everted or arched facing away from the neutral fiber.

Further variations are shown in FIGS. 5 and 6. In FIG. 5, the insulation layer 34, as is the case in FIG. 4, forms a conforming layer on a distal side of the proximal electrode 20, in which side a recess being transverse to the direction 12 is formed for each segment 22, wherein, in FIG. 6, the recesses are replaced by elevations 40. Above all, FIGS. 5 and 6 show the possibility that the slots 32 exhibit a basically constant thickness and that the distal and proximal electrodes 18 and 20 in the segments 22 are spaced apart at a basically constant distance dSp along the direction 12 across a slot 32. Exemplary, both the insulation layer 34 and the distal electrode 18 here are conformingly deposited layers, wherein the slots 32 result from a conformingly deposited and structured sacrificial layer, with subsequent removal.

Figure 7:
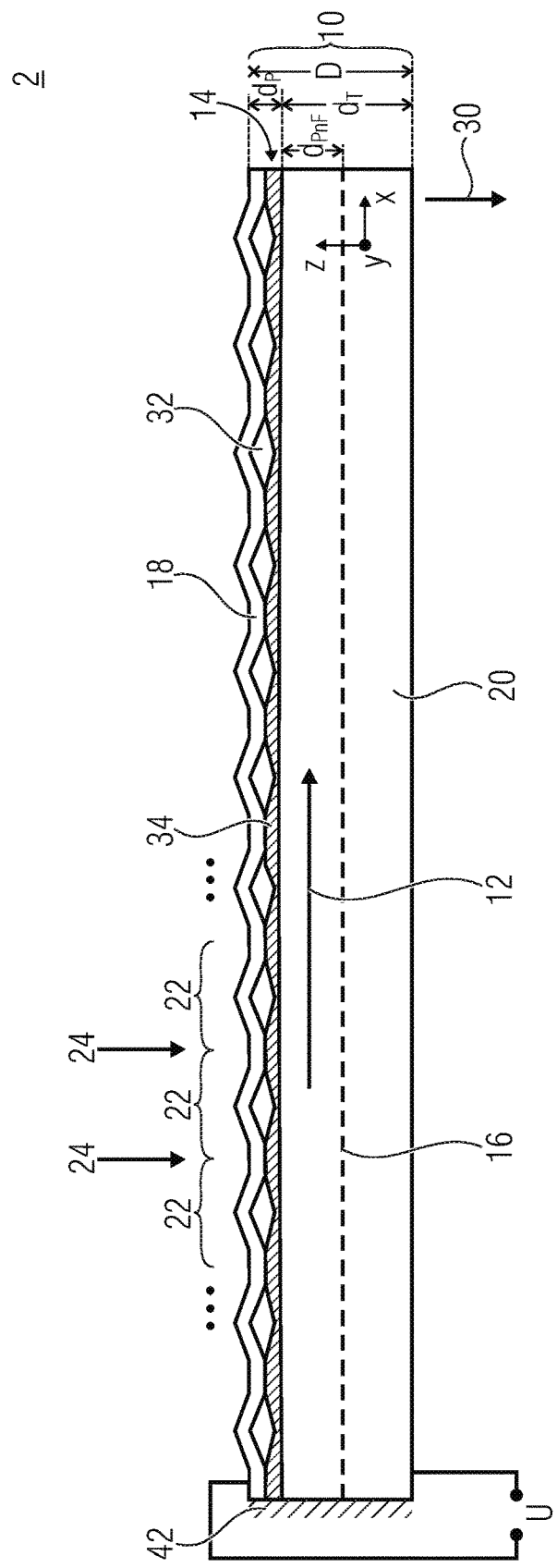
FIG. 7 shows a cross-section of a micromechanical device in accordance with an embodiment in which, in contrast to FIG. 1, the insulation layer is provided with a topography or does not exhibit a uniform thickness.

For reasons of completeness, FIG. 7 shows a modification of the above embodiments, according to which the insulation layer 34 may not be formed as a purely conforming layer of constant thickness, but as a layer 34 of varying thickness, to contribute at least partly to forming a topography and the slots 32.

Figure 8:
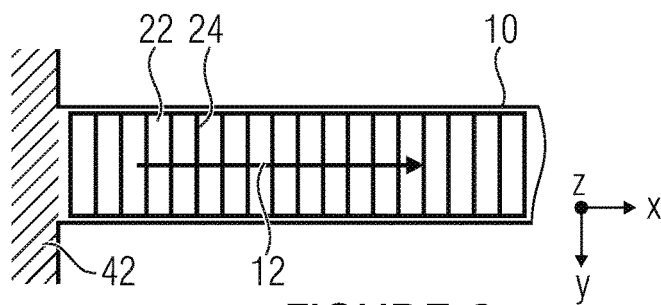
FIG. 8 shows a potential schematic top view of a micromechanical device in accordance with an embodiment according to which the deflectable element is implemented to be a cantilevered beam.
Figure 9:
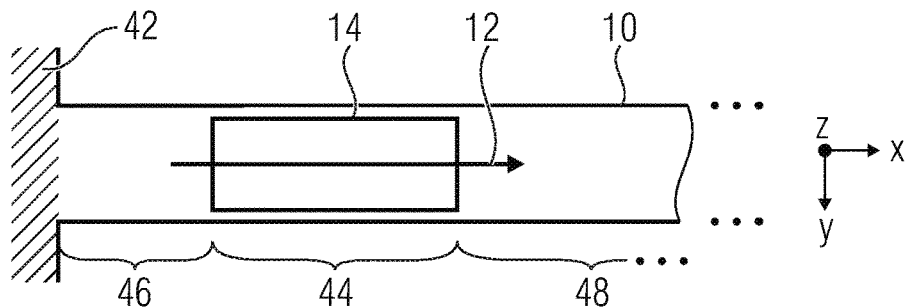
FIG. 9 shows a top view of a micromechanical device in accordance with an embodiment in which, in contrast to FIG. 8, the plate capacitor forming the electrostatic actuator is arranged to be spaced apart from the site of suspension and/or spaced apart from an end of the beam which is spaced apart from the site of suspension.

Without having been discussed in greater detail in FIGS. 1 to 7, it is to be pointed out that the deflectable element 10 may, for example, be a beam, such as, for example, a cantilevered beam, as is shown in the top view of FIG. 8, wherein the beam 10 here exemplary is suspended at a suspension 42 at its left end. The suspension has also been hinted at in FIGS. 1 to 7. As is shown in FIG. 8, the segments 22 and segment boundaries 24 are linear and transverse to the direction 12 along which the segments follow or are repeated one after the other. The direction 12 corresponds to the beam longitudinal direction. FIG. 9 exemplary shows that the plate capacitor 14 serving as the electrostatic actuator does not have to be formed over the entire length of the beam 10. The beam 10 may comprise, between the longitudinal portion 44 where the plate capacitor 14 is formed, and the suspension 42, a longitudinal section 46 in which no electrostatic actuator is formed, and/or a longitudinal section 48 on a side, further away from the suspension 42, which is free from an electrostatic actuator, wherein the beam in sections 44 to 48 does not necessarily have to be linear, as is shown here exemplary. The beam in section 46 and/or 48 exemplary exhibits a non-linear lateral course, that is a course folded in the lateral plane, that is in a plane perpendicular to the thickness direction z.

Figure 11:
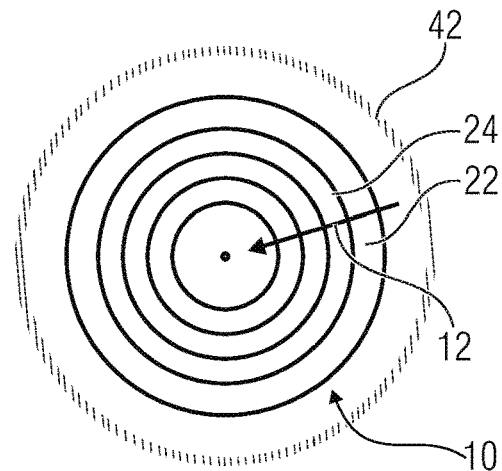
FIG. 11 shows a top view of a micromechanical device in accordance with an embodiment in which the deflectable element is implemented as a membrane.

For reasons of completeness, it is to be mentioned here that the deflectable element may also be a beam fixed at two sides which is folded or bulging when Euler's break criterion is met. FIG. 11 shows that the segments 22 and 24 do not necessarily have to be linear, but that exemplary the segment succession direction 12 corresponds to a radial direction and the segments 22 and segment boundaries 24 are formed to be concentric such that, when acting on the plate capacitor 14, the deflectable element 10 implemented as a membrane is arching out of the membrane plane, wherein the membrane exemplary comprises a periphery concentric also relative to the segments 22 and segment boundaries 24 and is suspended along this periphery.

Figure 12:
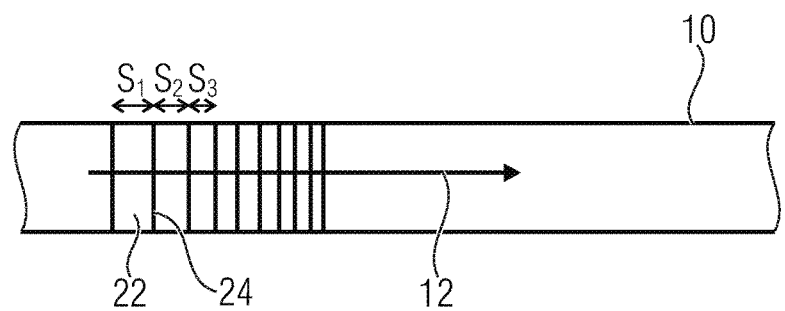
FIG. 12 shows a top view of a micromechanical device in accordance with an embodiment in which a segment width of the segments varies in the segment succession direction.

Finally, FIG. 12 shows a possibility that, unlike what has been illustrated so far, the segment widths in FIG. 12 do not have to be constant. In the above embodiments, the x axis, for example, has been along the direction 12. When numbering the segments 22 along the direction 12 with i, the widths si of the segments 22 along the direction 12 may exemplary decrease continuously, such as, for example, decrease in a monotonic or extremely monotonic manner. Unlike what has been illustrated so far, it would also be feasible for the thickness D in the direction 12 not to be constant, but also exhibit a continuously varying course, such as, for example, a varying thickness D along the direction 12, but a constant thickness transverse to the direction 12. The result, with both a variation of the segment widths and a variation of the thickness, would be a variation of the degree of curvature or the radius of curvature along the direction 12.

Figure 13:
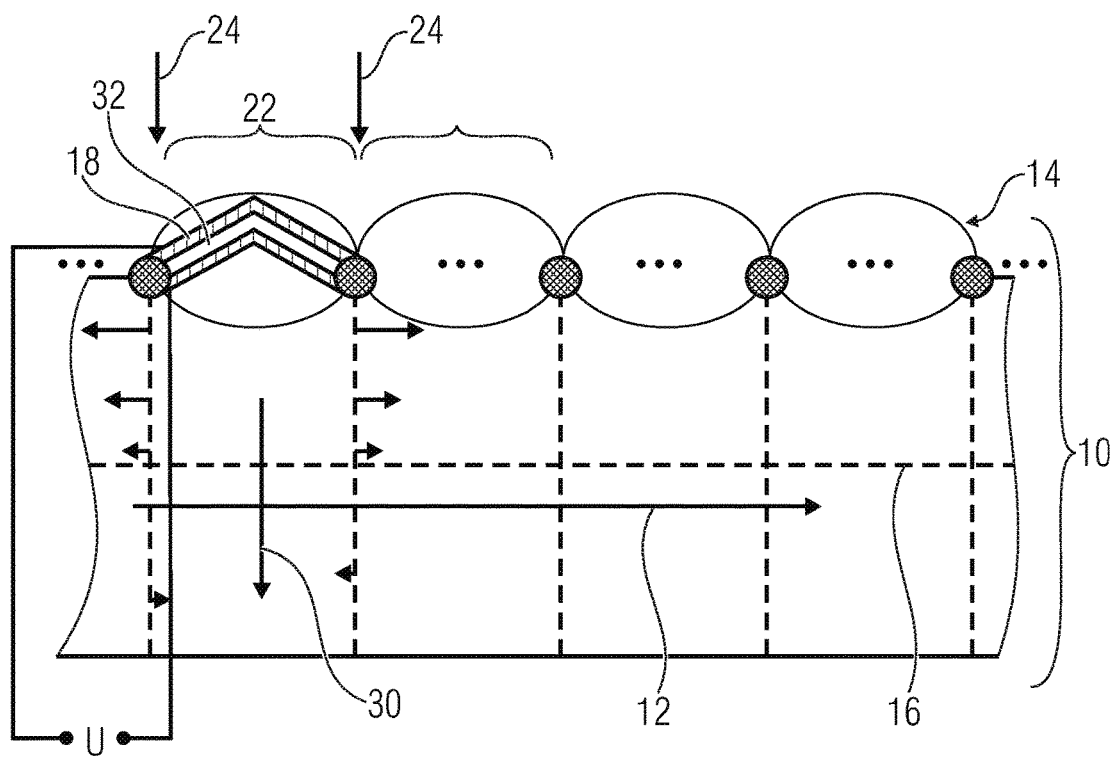
FIG. 13 shows a schematic cross-sectional view of a micromechanical device in accordance with an embodiment for illustrating the principle similar to the bimorph principle of deflection when deflecting the deflectable element when applying the voltage.

FIG. 13 again illustrates how the curvature of the deflectable element results from the bimorph-similar deflection by providing the plate capacitor 14 with a voltage. The plate capacitor 14 with its segment implementation and mechanical connection between the distal electrode 18 and the proximal electrode 20 at the segment boundaries 24 is illustrated in a highly schematic manner. The voltage U applied to the electrodes 18 and 20 causes an enormous electrical field between same across the gap 32, wherein the attractive forces between the electrodes 18 and 20 result in a transverse expansion along the segment succession direction 12, that is, in the thickness direction 30 spaced apart from the neutral fiber 16. In other words, by applying the voltage U, a lateral expansion of the element 10 along the direction 12 is caused, said mechanical expansion or tension decreasing in the thickness direction towards the neutral fiber 16 to drop to zero there and resulting beyond in a transverse contraction along the direction 12. All in all, the result is the curvature described before already, that is, in the case presently described, the element 10 curves such that the plate capacitor 14 is outside. However, as has already been described in the WO document mentioned in the introduction to the description of the present application, by suitably implementing the segments or the slot 32, theoretically a transverse contraction may be generated by the plate capacitor 14 or by applying a voltage to the capacitor 14 such that a curvature takes place in a reverse direction, that is such that the plate capacitor in a curved state would exhibit smaller a radius of curvature than the neutral fiber, and not vice versa, as illustrated so far.

Figure 10:
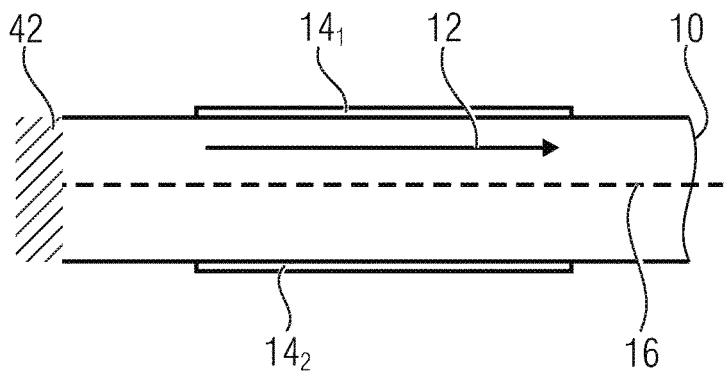
FIG. 10 shows a side view of a micromechanical device in accordance with an embodiment in which actuators, implemented as plate capacitors, are arranged on both sides of a neutral fiber of the deflectable element implemented here exemplary as a cantilevered beam, for either mutual support in the form of a deflection in the same direction, or an alternate deflection in the opposite orientation.

Although all the embodiments described before have shown that the plate capacitor is to be arranged on one side relative to the neutral fiber 16, it is also to be mentioned that an electrostatic actuator in the form of a plate capacitor may also be arranged on both sides of the neutral fiber, for example when activating the one electrostatic actuator, to curve the deflectable element in the one direction and to curve, when activating the plate capacitor of the other electrostatic actuator on the opposite side across the neutral fiber, the deformable element in the opposite direction. This means that the deformable element may be moved bidirectionally. This way is illustrated in FIG. 10 using plate capacitors 141 and 142 on both sides of the neutral fiber 16. A curvature in the same direction may also be achieved when the one plate capacitor, such as, for example, 141, is, as has been described, implemented such that it generates a transverse expansion, whereas the plate capacitor arranged on the opposite side, such as, for example, 142, generates a transverse contraction.

In accordance with the embodiment described above, it is, in contrast to the disclosure in the WO document mentioned in the introduction to the description of the present application, not necessary to structure laterally insulation islands as spacers between the distal and proximal electrodes. Instead, an insulation layer, continuous in the segment succession direction 12, is provided between the distal and proximal electrodes. As has already been described, the bending beam or bending membrane itself may take the function of the proximal electrode. A semiconductor material may be used here as the material 36, such as, for example, polysilicon, or a single-crystalline semiconductor material. Alternatives will be mentioned below. The continuously formed insulation layer 34 may, for example, be formed of $Al_2O_3$ or thermal $SiO_2$ by means of deposition. The selection of the material for the insulator 34 may exemplary be selected such that it has a low etching rate relative to the etching of the sacrificial layer by the removal of which the slot 32 forms after applying the distal electrode. If the material of the insulation layer 34 is of high selectivity when etching the sacrificial layer, the insulation layer may be kept extremely thin.

Manufacturing a micromechanical device in accordance with one of the preceding embodiments may be as follows. The starting point is the deflectable element including a proximal electrode with a planar surface or a surface provided with a topography. The insulation layer is applied thereon. After depositing the insulation layer 34, a sacrificial layer is deposited. It may, for example, be formed from PE-USG (=CVD-deposited $SIO_2$) or from other materials, wherein the material of the sacrificial layer should exhibit a considerably higher etching rate than the material of the insulation layer 34 when etching the sacrificial layer which results in the removal of the sacrificial layer so as to form the slot 32. Etching a PE-USG sacrificial layer may, for example, be done by so-called HF vapor etching. At first, after being deposited, the sacrificial layer is structured. In particular, it is removed by structuring at the segment boundaries 24 where the distal electrode 18 and the proximal electrode 20 are to be in mechanical contact to each other, here by means of the insulation layer 34. Expressed differently, in accordance with the above embodiments, the distal electrode 18 sticks to the insulation layer 34 at the segment boundaries 24, due to the insulation layer 34 being continuous. The sacrificial layer structuring causes the sacrificial layer correspondingly to remain only at those positions where, after manufacturing, the slot 32 remains, wherein in between insulation windows where the insulation layer 34 is exposed are formed in the sacrificial layer. Subsequently, the distal electrode 18 is deposited and structured. When being deposited, the distal electrode makes mechanical contact with the insulation layer 34 in the region of the insulation windows just mentioned, that is at the segment boundaries 24. The structuring here serves for defining the lateral shape of the distal electrode 18. The sacrificial layer is then etched away, such as, for example, by means of HF vapor etching, the result being the structure described already above for different embodiments.

The lateral shape and the thickness of the deformable element may be defined using additional steps which, however, do not belong to the actual process of generating the deformable element. Exemplary, the thickness D of the deformable element may be changed by additional back side etching, such as, for example, TMAH or KOH etching from the back side of a BSOI wafer. The lateral shape of the deformable element may, for example, additionally be defined by deep reactive ion etching (DRIE or a Bosch process). Further process steps may be performed to introduce bond pads, electrical conductive tracks or further functional elements, for example.

With regard to FIGS. 1 to 13, it is also pointed out that a non-planar shape of the distal and/or proximal electrode has been illustrated in these figures by only a pointed-roof topography. However, modifications thereof are conceivable. The topography of the distal and proximal electrodes may be defined to be different, such as, for example, as a continuously bent or wave-shaped arching.

Further embodiments where a micromechanical device avoids using the side of the proximal electrode facing the distal electrode as an etch stop layer will be described below. In contrast to the embodiments described before, no insulation layer continuous in the direction of the segment succession direction which extends between the two electrodes is used but the proximal electrode is structured here.

Dispensing with structuring an insulation layer in order to form spacers between the electrodes of the plate capacitor while using the bottom electrode as an etch stop layer, without having an insulation layer between the distal and proximal electrodes of the plate capacitor, may be of advantage. The reason for this is that providing an insulation layer 34 between the proximal electrode and the distal electrode, as shown in the previous embodiments, due to the dielectric material between the two electrodes, influences the strength of the electrical field of the plate capacitor and, thus, the electrostatic force acting between the two electrodes and, in turn, the actuating force of the electrostatic actuator which is formed by the plate capacitor. Additionally, charge carriers may be captured in the insulation layer 34, which might stay there, resulting in a changed deflection-voltage characteristic curve of the electrostatic actuator. The embodiments described below represent a modification of the embodiments described so far, according to which no continuous insulation layer 34 between the distal and the proximal electrodes is necessitated, meaning that conversely the actuating principle may not be influenced negatively by such an insulation layer.

Figure 14:
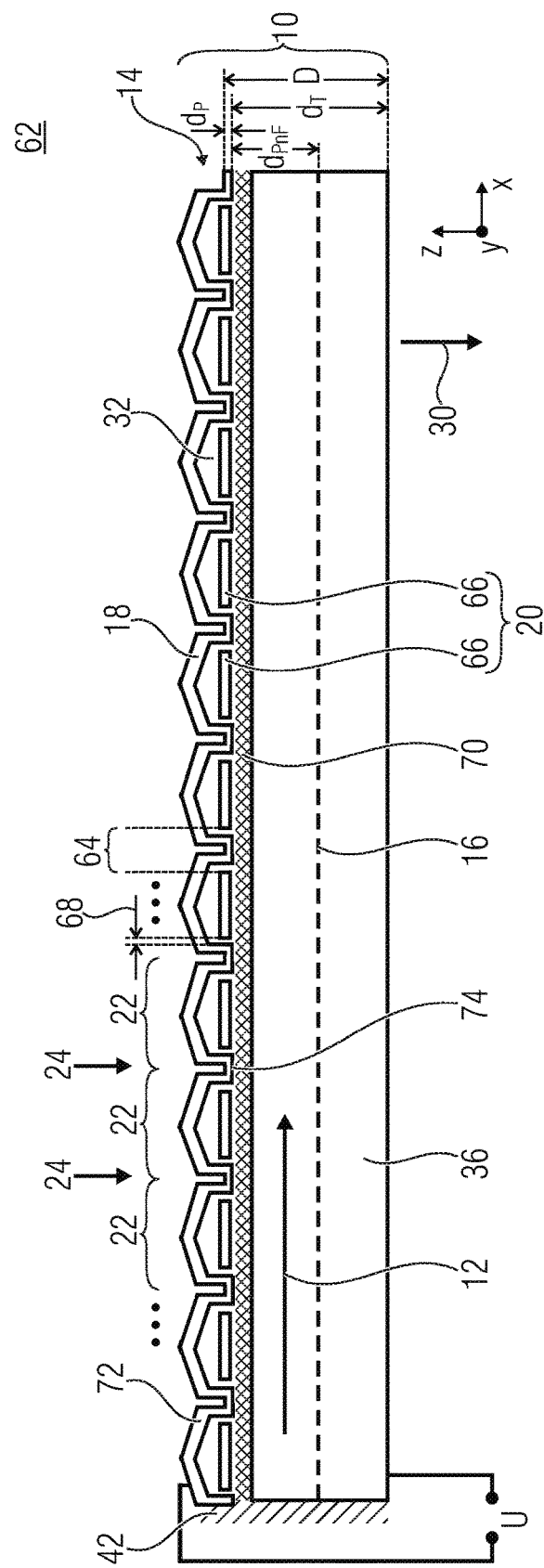
FIG. 14 shows a cross-section of a micromechanical device in accordance with an embodiment in which, in contrast to the embodiment of FIG. 1, not a continuous insulation layer between the proximal and distal electrodes is used, but a structured proximal electrode is provided.

A first embodiment of this type is illustrated in FIG. 14. FIG. 14 shows a micromechanical device 62 using the same reference numerals, like in the previous figures, for elements of the micromechanical device corresponding in function, wherein the following discussion particularly emphasizes the differences to the embodiments described before and otherwise the remaining functional context between the elements may be gathered from the previous description. As becomes obvious when comparing FIG. 14 to the previous figures, the insulation layer 34 between the distal and proximal electrodes is missing in the micromechanical device of FIG. 14. Instead, the proximal electrode is not of a type continuous in the segment succession direction 12, but it is structured so as to exhibit gaps 64 at the segment boundaries 24 and be spaced apart from the distal electrode 18 which extends at the segment boundaries up to laterally between the portions 66 of the proximal electrode 20 spaced apart along the direction 12, that is across a lateral distance 68, whereas the distal electrode 18 is formed to be continuous along the direction 12. Expressed differently, the distal electrode 18 is fixed or mounted mechanically at the segment boundaries 24 by being mechanically connected to the insulation layer 34 laterally spaced apart from the proximal electrode 20.

In the case of FIG. 14, the insulation material where the distal electrode is fixed at the segment boundaries, is formed by a specifically provided insulation layer 70 on a side of the actual carrier 36 facing the plate capacitor 14, wherein, similar to the previous embodiments, with regard to the alternatives of providing a separate electrode layer for forming the proximal electrode and taking over the functionality of the proximal electrode by the carrier material itself, the carrier material 36 in the case of FIG. 14 may also be implemented to be an insulator and, thus, form the insulator material itself on the side facing the distal electrode 18 of which the proximal electrode 20 is formed and structured to form the portions 66. The side of the insulation material facing the distal electrode is indicated in FIG. 14 by the reference numeral 72. In the embodiment of FIG. 14, the electrode 18 is thus formed in a distance to the insulation layer 72 which varies in the thickness direction 30, that is it extends up to the surface 72 at the segment boundaries 24 to be connected to it mechanically, whereas it is spaced apart from the surface 72 between the segment boundaries 24 in each segment 22. The portions 66 of the proximal electrode 20 comprise, at locations 74 where the distal electrode 18 is mechanically coupled to the insulation material, their gaps 64 which are sufficiently large along the direction 12 in order for a corresponding portion 66 of the proximal electrode 20 to be spaced apart from the distal electrode 18 in each segment 22 on both sides in a lateral direction, that is along the direction 12. In the segments 22, the distal electrode 18 and the proximal electrode 20 or the corresponding portion 66 of the latter are spaced apart from each other across the gap 32.

It is to be pointed out that, for reasons of improved visibility, the course of the distal electrode 18 is indicated to be exaggeratedly loop-shaped at the segment boundaries 24 along the direction 12. Some embodiments will be described below.

With regard to its mode of functioning, the electrostatic actuator implemented as the plate capacitor 14 of the micromechanical device 62 of FIG. 14 corresponds to that of the embodiments of FIGS. 1 to 13 described before. This means that, by applying the voltage U between the distal electrode 18 and the proximal electrode 20, the plate capacitor 14, spaced apart from the neutral fiber 16 by the distance dPnF, generates a lateral tension expansion which in analogy to the bimorph principle, results in a curvature of the mechanical device 62 in the thickness direction 30, that is, in FIG. 14, downwards. Thus, the portions 66 of the proximal electrode 20 may be, for example, short-circuited to one another such that the same voltage between distal electrode 18 and proximal electrode 20 is applied to each segment 22. However, it would also be conceivable to short-circuit the portions 66 only in groups, such as, for example, in groups to form directly successive segments along the segment succession direction 12. Thus, it would be possible to vary the voltage U, applied across the gap 32 to the electrodes 18 and 20 in the respective segment 22, in sections along the direction 12, that is in portions which correspond to the groups mentioned, such as, for example, in a manner increasing or decreasing monotonically from the suspension 42 along the direction 12, so that the curvature along the direction 12, for example, also changes with a voltage U applied. Applying an individual voltage to the individual element 66 would, of course, also be conceivable.

While FIG. 14 has illustrated the elements 66 of the proximal electrode 20 to be applied on the surface 72 of the insulation material, it is alternatively also possible for the individual element 66 to be embedded into the insulation material to be flush with the surface 72, for example.

Figure 15:
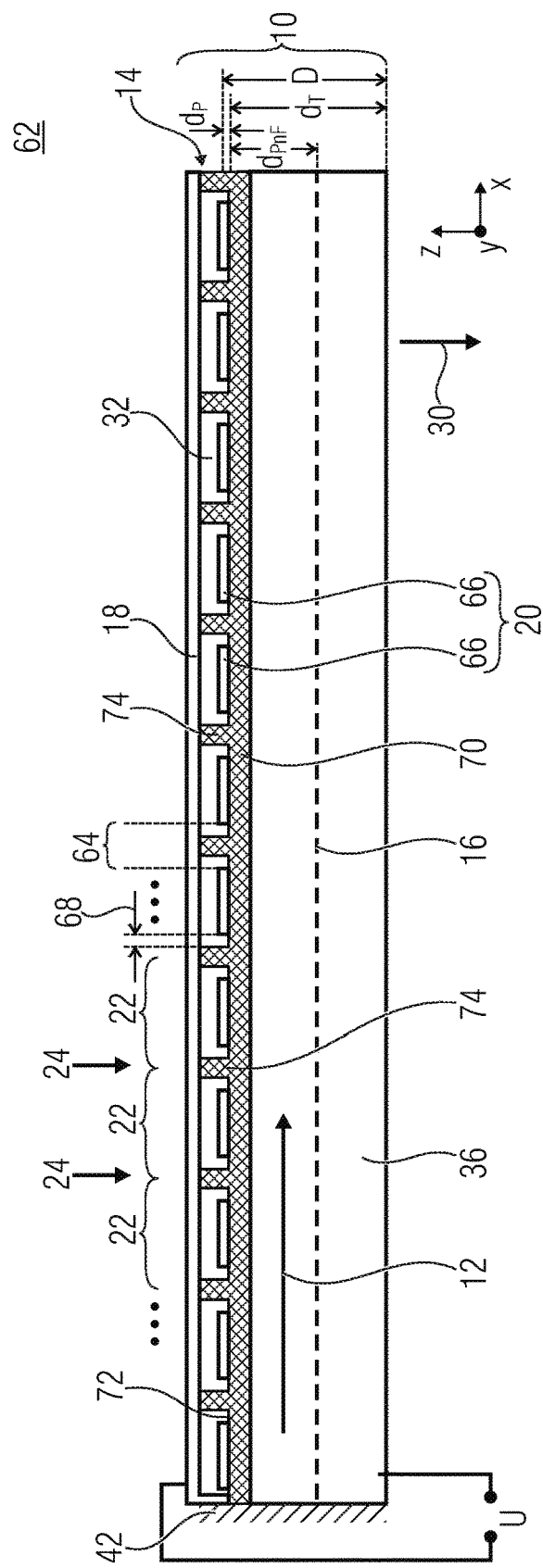
FIG. 15 shows a cross-section of a micromechanical device in which, in contrast to FIG. 14, the insulation layer is provided with a topography.

In addition, it is also possible, as shown in FIG. 15, to shape the slot 32 in the segments 22 between the distal electrode 18 and the proximal electrode 20 different from what has been illustrated in FIG. 14. In the case of FIG. 14, the side 72 of the insulation material facing the distal electrode 18, for example, has been implemented to be planar and the distal electrode has varied in its distance to the surface 72 along the direction 12 so as to be connected mechanically to the insulation material at the segment boundaries 24 and otherwise be spaced apart from the respective portion 66 of the proximal electrode 20 across the gap 32 within the segments 22. FIG. 15 represents a way according to which the insulation layer 70 exhibits a topology, that is not provided to be a conformingly deposited layer of basically constant thickness. Rather, in the case of FIG. 15, the insulation layer 70 comprises, at the segment boundaries 24, projections 74 which serve as spacers on which the distal electrode 18 is supported so as to be opposite the proximal electrode 20 or the respective portion 66 across the slot 32 in the segments 22, wherein the portions 66 in turn are formed in the corresponding recesses between the projections 74 on the surface 72. The distal electrode 18 may thus, as illustrated in FIG. 15, exhibit a planar course or, alternatively, a course varying in the thickness direction 30 along the direction 12. Like in the other embodiments, the distal electrode 18 may also be implemented to be a layer deposited conformingly onto the surface 72 which at the segments 22 between the segment boundaries 24 is additionally covered with a sacrificial material, the layer comprising a basically constant thickness. In the embodiment of FIG. 15, the slot 32 consequently has an essentially constant thickness or width between the electrodes 18 and 20 in each segment 22 along the direction 12.

Figure 16:
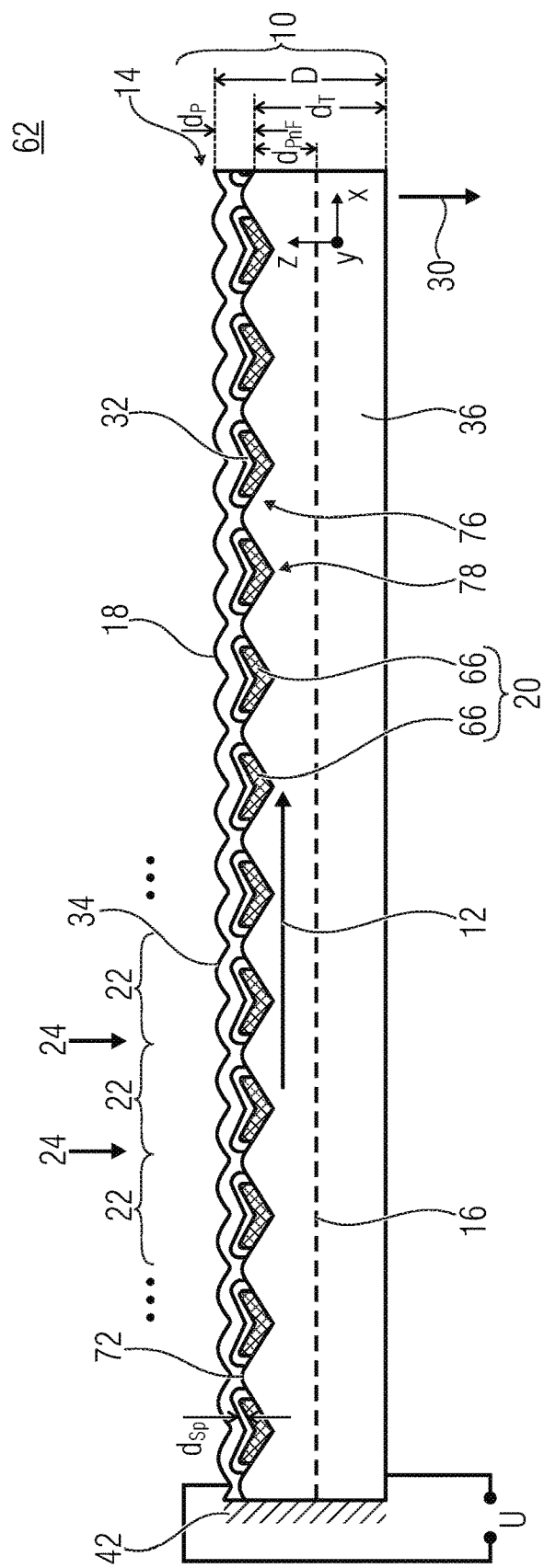
FIG. 16 shows a cross-section of a micromechanical device in accordance with an embodiment in which the side of the insulation material facing the distal electrode where the proximal electrode is formed and structured and where the distal electrode is fixed at the segment boundaries is provided with a topography which the proximal electrode follows as a conformingly applied layer, and in which the slots within the segments result from the succession of a conforming deposition of sacrificial material and the distal electrode with subsequently removing the sacrificial material.

FIG. 16 shows that the surface 72 of the insulation layer facing the distal electrode 18, instead of being implemented to be planar, may also exhibit a topography, for example with projections 76 arranged at the segment boundaries 24 and recesses 28 therebetween, that is one recess 78 per segment 22. The proximal electrode 20, or the sections 66 thereof, is/are provided as a conformingly deposited layer of essentially constant thickness, as is the distal electrode 18 which is opposite the respective element 66 of the proximal electrode 20 across a slot 32 of constant thickness in each segment 22 and is mechanically connected to insulation material at the segment boundaries 24, that is, at the projections 76. FIG. 16 represents the alternative case to FIGS. 14 and 15, according to which the insulation material of the carrier 36 itself is the insulation material but, as has been mentioned before, the insulation material may also be provided by a specially provided layer. In this case, this layer 70 may be a conformingly deposited layer of essentially constant thickness which follows the topography provided in a side of the carrier 36 facing the distal electrode 18.

Figure 17:
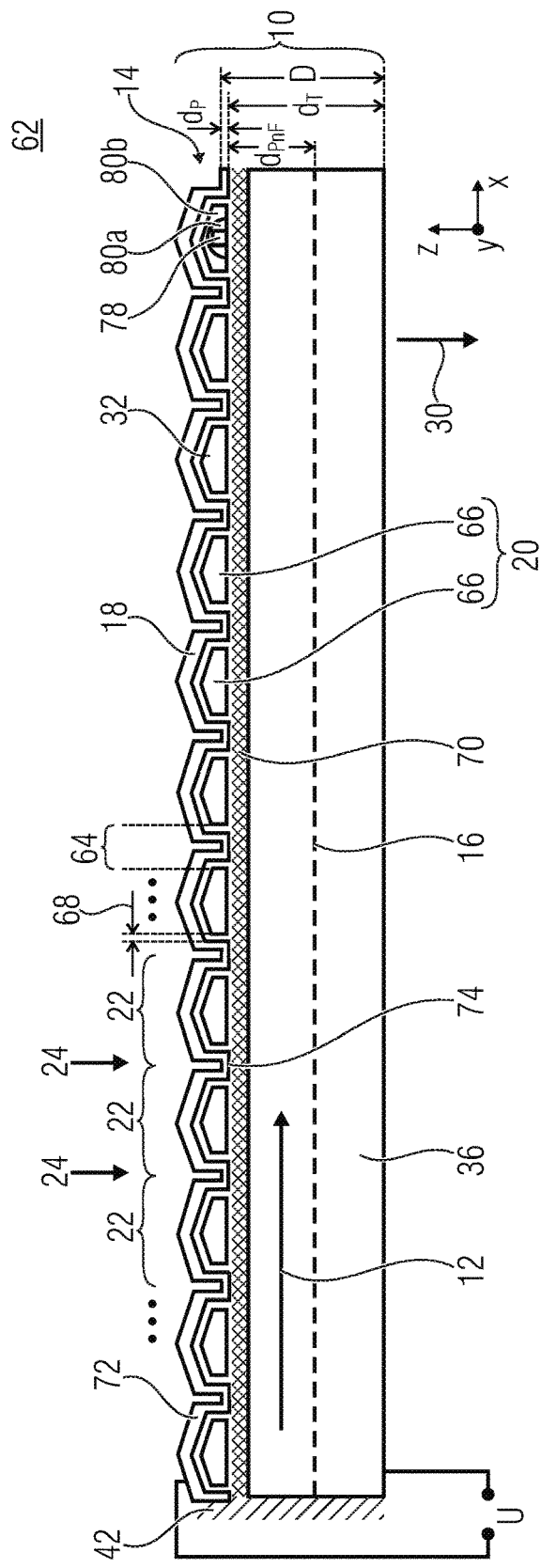
FIG. 17 shows a cross-section of a micromechanical device in accordance with an embodiment in which, in contrast to FIG. 14, the portions of the proximal electrode are not formed as a planar layer.

In the embodiment of FIG. 16, the result are slots 32 between the electrodes 18 and 20 which, in the respective segment center 22 relative to the direction 12, exhibit a cross-section which, in the direction of the surface 72, is arched or buckled but, otherwise, has an essentially constant width in the thickness direction 30. Of course, there is also an alternative according to which the projections 76 are arranged in the segment centers and the recesses are aligned to the segment boundaries 24, the result being slots 32 which comprise a reverse arching or buckling in cross-section, that is, one pointing in the distal direction, that is away from the neutral fiber 16. In both cases, the side of the proximal electrode 20 or portions 66 facing the distal electrode 18 has a non-planar course of the distal electrode 18 across a constant distance or slot 32 of constant thickness, wherein the topography of that side of the proximal electrode 20 facing the distal electrode 18 stems from the underlying topography of the insulation material and the proximal electrode is deposited to be a conforming layer. FIG. 17 shows that, alternatively, the material of the proximal electrode 20 may also be applied differently. The portions 66 may particularly be provided with a topography, that is protrude from the surface 72 in height, which varies along the direction 12. In FIG. 17, for example, the portions 66 of the proximal electrode 20 are formed as projections on the surface 72 which comprise a non-planar side facing the distal electrode 18, that is a side with a topography, wherein FIG. 17 illustrates the exemplary case in which the top side of the portion 66 is spaced apart from the distal electrode 18 across a gap 32 of constant thickness. It is indicated exemplary at a portion 66 of the proximal electrode 22 that the elements 66 may be formed by repeatedly depositing and structuring in order to achieve the desired topography on its side facing the distal electrode 18. In particular, a rib 78 of centered course in each segment 22 extending transverse to the direction 12 may be present onto which one or several layers 80a, 80b are deposited one after the other and structured so as to expose the insulation material at the gaps 64. Thus, the rib 789 may exemplary be made from a conductive or non-conductive material, wherein the same applies for layers of the at least one layer 80a, 80b, except for the outermost layer facing the distal electrode 18 among same, that is in FIG. 17 80a, which is made from a conductive material.

Figure 20:
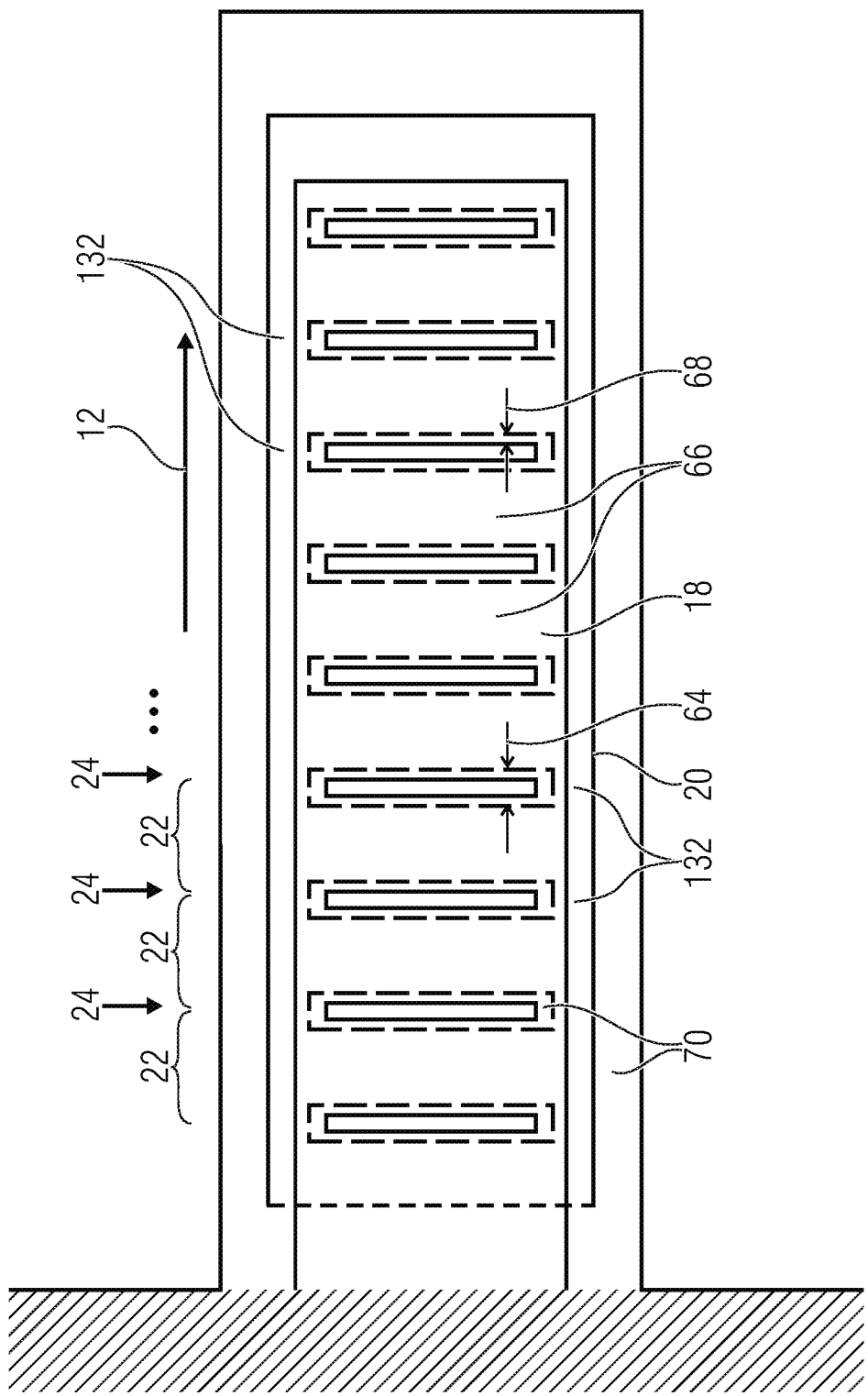
FIG. 20 shows a possible top view of a micromechanical device in accordance with FIG. 14, also representative of devices in accordance with one of FIGS. 15 to 19J.
Figure 21:
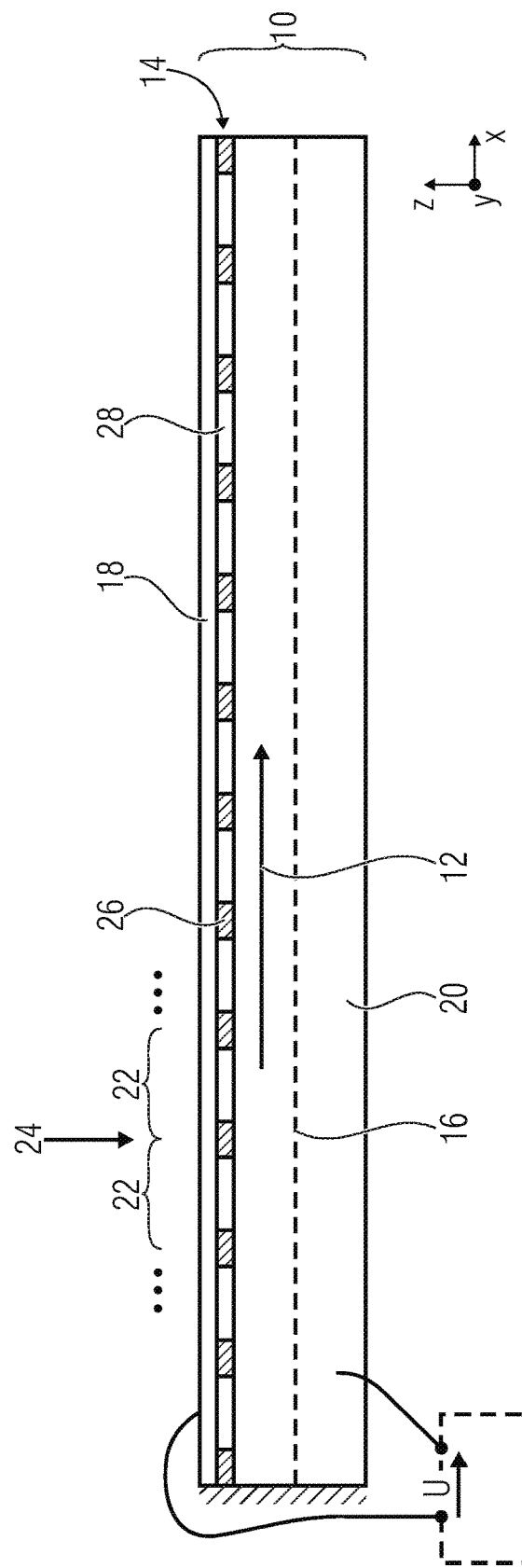
FIG. 21 shows a cross-sectional view of a known micromechanical device comprising an electrostatically operating actuator the mode of functioning of which follows the bimorph principle.

With regard to further ways of varying the embodiments of a micromechanical device in accordance with FIGS. 14 to 17, reference is made to FIGS. 8 to 13 in which the explanations where really related to embodiments of FIGS. 1 to 7 but also apply correspondingly to the embodiments of FIGS. 14 to 17. For reasons of completeness, FIG. 20 shows the top view of FIG. 8 transferred to the case of FIG. 14 in a less schematic illustration for the exemplary case of a fixed electrical contacting or fixed short-circuit of the electrode portions 66 of the proximal electrode, which are separated from one another by gaps 64, among one another, that is across connective portions 132 extending along the segment succession direction 12, exemplary on both sides, that is on the left and right in the direction 12, although other solutions are also possible, such as, for example, an only one-sided arrangement of the portions 132. The distal electrode 18 is mounted within the gaps 64, with a lateral distance 68 to the proximal electrode 20.

For manufacturing a micromechanical device in accordance with a type described referring to FIGS. 14 to 17, the insulation layer 70 which may exemplary be formed from aluminum oxide or $Al_2O_3$, or thermal oxide such as, for example, $SiO_2$, may exemplary be deposited on a bending beam or membrane 36. The insulation layer 70 has lower an etch rate when etching the sacrificial layer by the removal of which the slots 32 will form later on. This insulation layer 70 thus advantageously has a high selectivity when etching the sacrificial layer. The proximal electrode 20 such as, for example, with aluminum, Al, or titanium aluminide, TiAl, is deposited and structured on the insulation layer 70, for example. The structuring defines the lateral shape of the proximal electrode 20 and may additionally generate "insulation windows" or gaps 64 in the proximal electrode 20. The insulation windows 64 are those regions where later on the distal electrode 18 is mechanically directed to the rest of the deflectable element via the insulation material. The insulation windows 64 are exemplary dimensioned such that there is no electrically conductive connection between the distal electrode 18 on the one hand and the bottom electrode 20 on the other hand. Then, a sacrificial layer is deposited, such as, for example, PE-USG, or other materials having higher an etch rate than the insulation layer 70 when etching the sacrificial layer. Etching the sacrificial layer may, for example, be done by so-called HF vapor etching. The sacrificial layer is then structured laterally at those positions where later on the distal electrode is to be in mechanical contact to the insulation layer 70. This means that structuring the sacrificial layer takes place mainly within the insulation windows 64 of the proximal electrode 20, wherein the insulation windows of the sacrificial layer are formed in this way. Subsequently, the distal electrode 18 is deposited and structured laterally. The distal electrode 18, when being deposited, makes mechanical contact to the insulation layer 70 in the region of the insulation windows of the sacrificial layer. Structuring only serves for defining the shape of the distal electrode 18. The sacrificial layer is then etched, such as, for example, by HF vapor etching, and, thus, removed. The slots 32 result at those locations where the sacrificial layer has been removed. The mechanical device is then finished.

The lateral shape and the thickness of the bending beam or micro actuator may be defined using additional process steps which actually do not belong to the process of forming the deflectable element including its electrostatic actuator. Exemplary, the thickness of the bending beam may be changed by additional TMAH or KOH etching from the backside. Exemplary, an SOI wafer may be started from, as will be discussed later on. A lateral shape of the deflectable element exemplary formed as a bending beam may additionally be defined by deep reactive ion etching, such as, for example, by DRIE or a Bosch process. Further process steps may be provided in order to attach bond pads, electrical conductive tracks or further functional elements, for example.

As regards the micromechanical devices in accordance with the embodiments of FIGS. 14 to 17, it is pointed out that not only pointed roof-shaped topographies of the distal electrode are possible. Rather, they may also be arched or the like. As has been discussed, it is possible to define the topographies of the distal electrode and/or the bottom electrode by means of other methods than have been discussed so far. Again, it is to be pointed out that, in contrast to the embodiments having been discussed referring to FIGS. 1 to 13, the gross of the deflectable element, that is of the carrier material 36, can no longer take the function of the proximal electrode, but same is applied separately as a thin layer, for example. However, it is still possible for the gross of the deflectable element, that is the carrier material 36, to be formed from an electrically conductive material. It may also be of advantage to short the carrier material to the proximal electrode or to the distal electrode. In this way, defined electrical potentials below the electrostatic actuator may be provided.

Figure 18A:
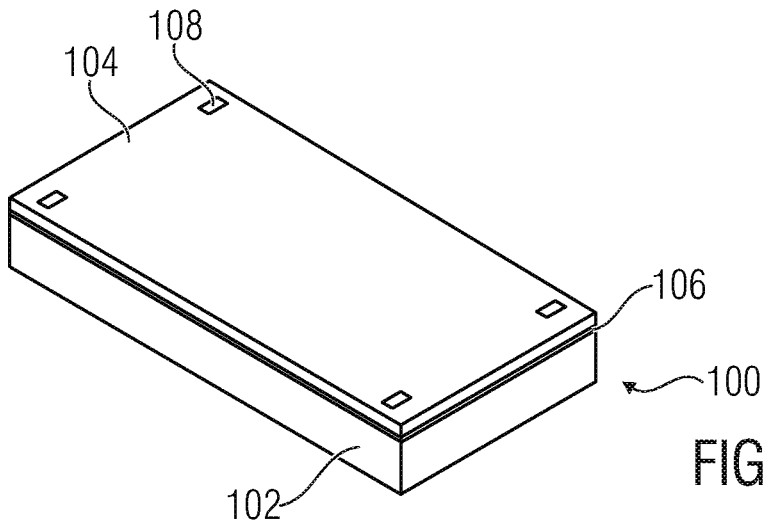
FIGS. 18A-18J each illustrate a spatial representation of results of process steps of a manufacturing method for manufacturing a micromechanical device which corresponds to that of FIG. 17.
Figure 18B:
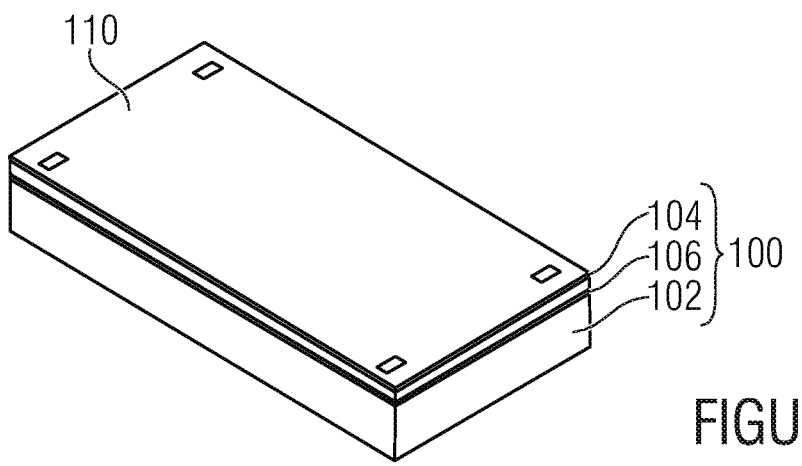
Figure 18C:
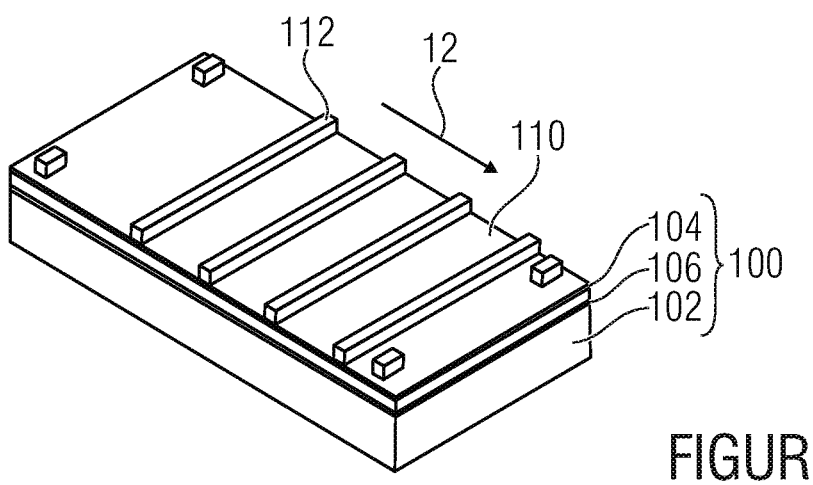
Figure 18D:
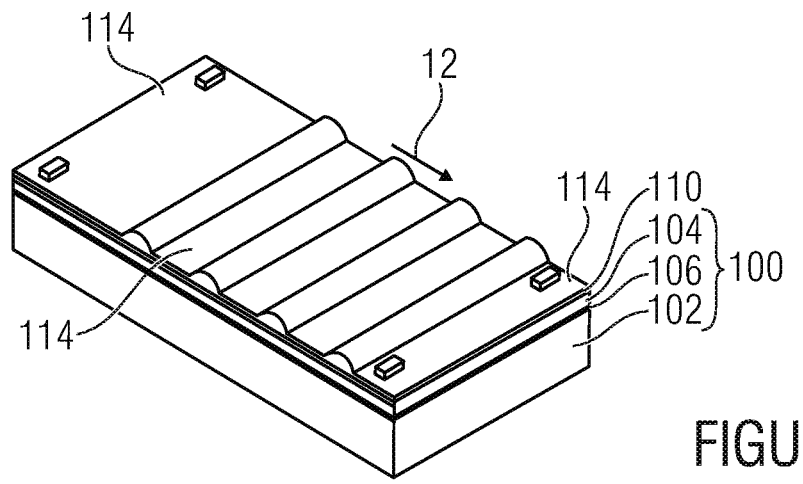
Figure 18E:
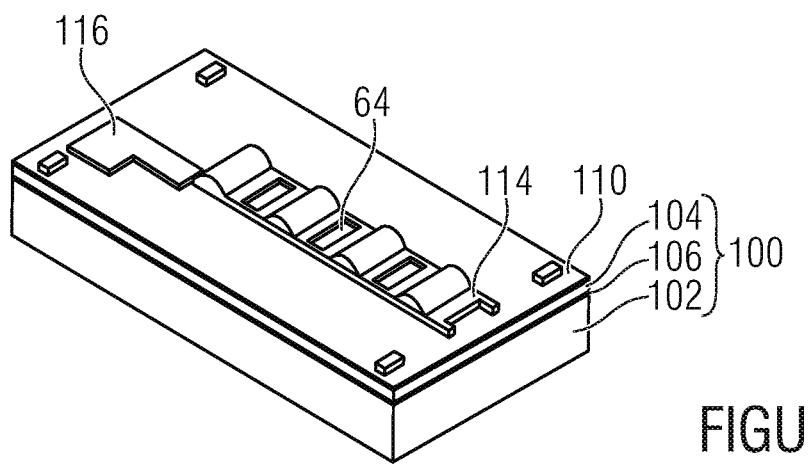
Figure 18F:
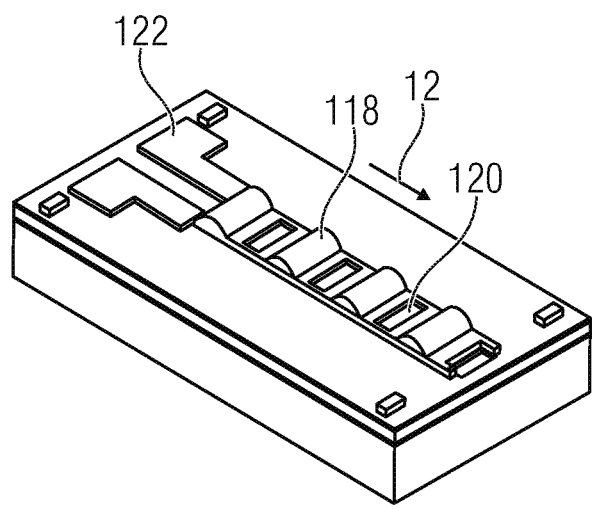
Figure 18G:
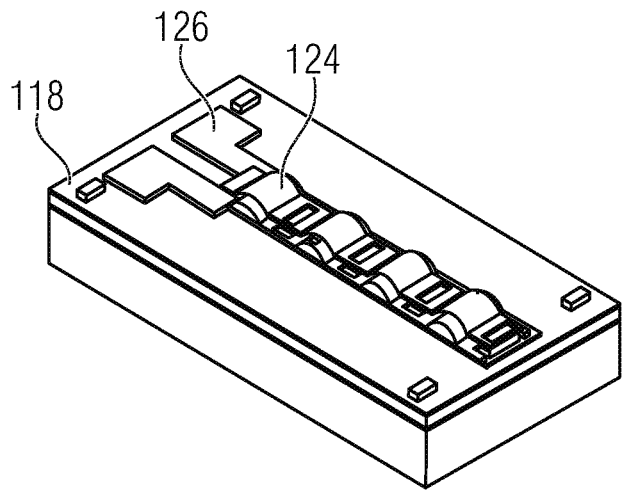

A manufacturing process for manufacturing a micromechanical device in accordance with one of FIGS. 14 to 17 will be described with reference to FIGS. 18A to 18J that is similar to the type shown in FIG. 17. The process starts with a wafer 100 with a substrate 102, a semiconductor layer 104 and an insulation layer 106 buried therebetween, wherein FIG. 18A also illustrates that adjusting marks 108 might have been structured and etched into the wafer. The carrier 36 of the deflectable element, which exemplary is implemented here as a beam, will be formed from the semiconductor of the layer 104. As is shown in FIG. 18B, an insulation layer 110, which corresponds to the insulation layer 70, is then deposited on the semiconductor layer 104. Deposition exemplary takes place such that the forming insulation layer 110 has a thickness of 400 nm and is done by means of depositing $Al_2O_3$ using ALD, for example. Then, as is shown in FIG. 18c, rod-shaped ribs 112 are formed on the insulation layer 110, such as, for example, by depositing and structuring a suitable material over the entire area, such as, for example, structuring a 1000 nm TiAl layer, depositing taking place, for example, by PVD. A rod-shaped rib, which exemplary corresponds to the rib 78 of FIG. 17, forms in this way, namely one rib per segment transverse to the direction 12. These ribs serve for providing the topography. Expressed differently, the topography layer which in the present case exemplary is a metal layer, is structured to form ribs 112 in order to obtain, by means of depositing a second layer, a side of a proximal electrode facing the distal electrode, which exhibits the desired topography. Depositing this second layer which defines the side of the proximal electrode which later on faces the distal electrode is shown in FIG. 18D. In particular, a deposition of, again, 1000 nm TiAl takes place by means of PVD, for example, the result being a layer 114 of the desired topography, by the layer 114 covering the surface of the insulation layer 110 with the ribs 112 on top. The layer 114 exemplary corresponds to the layer 80a of FIG. 17. In particular, one projection, extending transverse to the direction 12, in the top side of the layer 114 results per segment. In a subsequent step, the result of which is shown in FIG. 18E, the layer 114 is structured laterally. Exemplary, the insulation windows 64 are structured into the layer 114, but as regards the outer periphery, the layer 114 is, for example, structured already so as to correspond, for example, to the extensions of the deflectable element to be and exemplary form a terminal pad 116. Thus, the insulation layer 110 is exposed at the insulation windows 64 in the layer 114. After that, deposition of the sacrificial material takes place, such as, for example, as a 200 nm USG layer, exemplary by means of PE-CVD. The sacrificial layer is structured, the result of structuring the sacrificial layer 118 being shown in FIG. 18F. In particular, the sacrificial layer is structured such that internal portions 120 of the insulation layer 110 within the insulation window 64 are exposed, that is at least in the direction 12 with keeping the distance 68 between the portions 120 on the one hand and 64 on the other hand is kept. In addition, the sacrificial layer 118 is removed where a terminal pad and a feed line are to result for the distal electrode, this being indicated exemplary by 122. The latter distance provides for, when removing the sacrificial layer, that the distal electrode will not be under-etched at the bond pad and the feed line and, as a consequence, break apart from the chip.

After that, the distal electrode is applied by applying a conductive layer 124, with subsequent structuring. Exemplary, a 500 to 1000 nm TiAl layer is deposited by means of PVD. Structuring exemplary relates to the outer periphery of the layer so as to basically correspond to the shape of the deflectable element, and define the feed line and the bond pad 126 mentioned before.

Figure 18H:
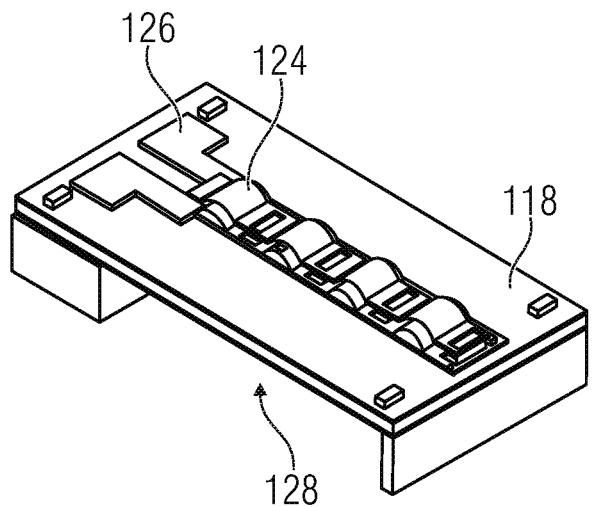

As is shown in FIG. 18h, subsequently, a hard mask may exemplary be deposited on a wafer back side of the wafer and structured so as to etch the carrier substrate 102 of the wafer 100 from below by anisotropic etching by means of TMAH, for example. The result is a recess 128 on the back side of the wafer 100 at that position where the deflectable element is going to be. The recess 128 extends from the back side of the wafer 100 up to, for example, the buried insulation layer 106. It is to be pointed out that the recess or trench 128 in FIG. 18h is illustrated in a simplified manner to be rectangular but that, in reality, the geometry of the recess rather corresponds to an upside-down pyramid frustum.

Figure 18I:
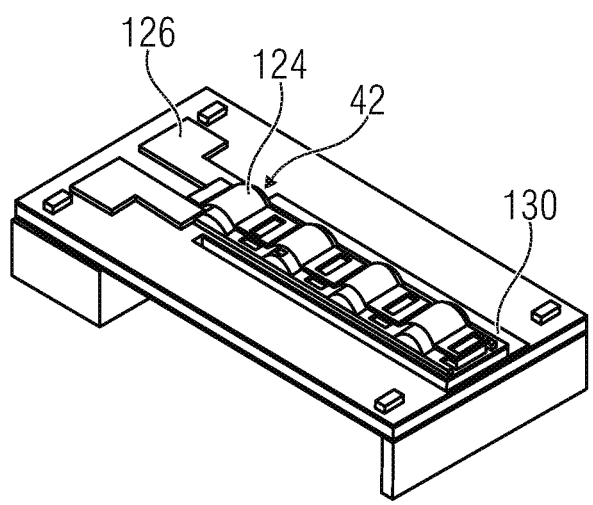

After that, as is shown in FIG. 18I, an opened trench 130, that is continuous in the thickness direction, is etched around the deflectable element to be, such as, for example, by means of DRIE, except for the location of the suspension 42 so as to form in this way the deflectable element formed as a cantilevered beam, for example. However, reference is made to FIGS. 8, 11 from which it becomes obvious that the trench 130 may also be implemented to be different, such as, for example, divided into two trenches, to result in a beam suspended on two sides so that the trench or trenches 130 may also be non-linear, but curved or bent, and that there may not be any trenches when the deflectable element represents a membrane, for example. A typical trench width in the lateral direction exemplary is 3 µm to 15 µm. The trench depth basically corresponds to the thickness of the semiconductor layer 104, which typically is in a range from 5 µm to 100 µm. In the exemplary case of FIG. 18I, the framing of a bending beam as a deflectable element may be obtained in this way.

Figure 18J:
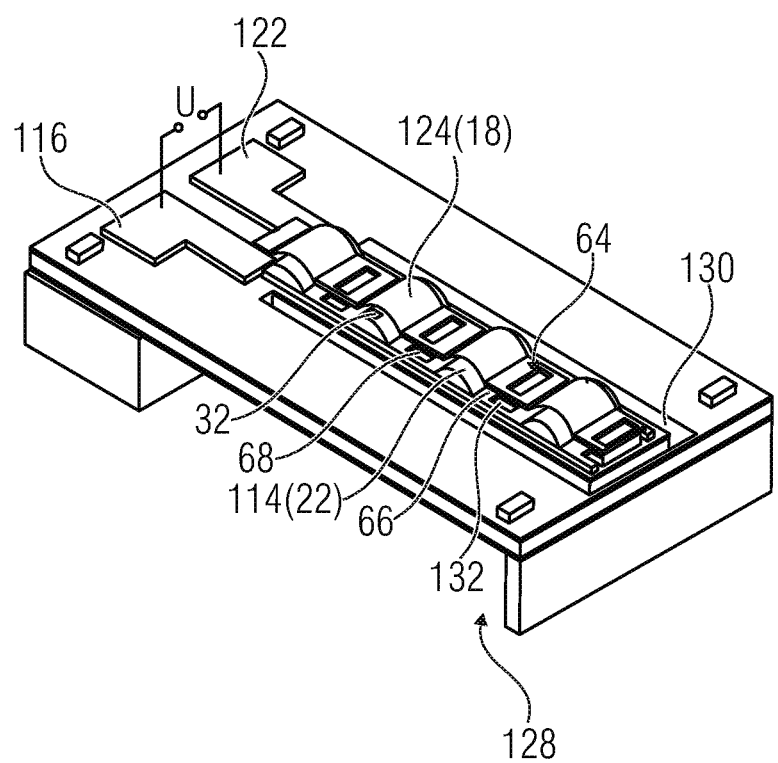

FIG. 18J shows the result after removing the sacrificial material. Sacrificial layer etching may, for example, take place in vapor HF. The sacrificial material 118, which exemplary may be an USG layer, as described before, is removed by this step. The distal electrode formed by the layer 124 is under-etched by this so as to form the slots 32. The result is the exposed distal electrode 18 from the layer 124, and the distal electrode 124 and the entire bending beam which is framed by the trench 130 may be deflected in an actuating manner similar to the bimorph principle described above by applying a voltage U between the electrode terminals 122 and 116. FIG. 18J also illustrates that the short-circuit among the portions 66 of the proximal electrodes which is formed by the layer 114 may be formed by portions of the layer 114 which are illustrated in FIG. 18J by 132 and are guided laterally around the insulation island 64.

Figure 19A:
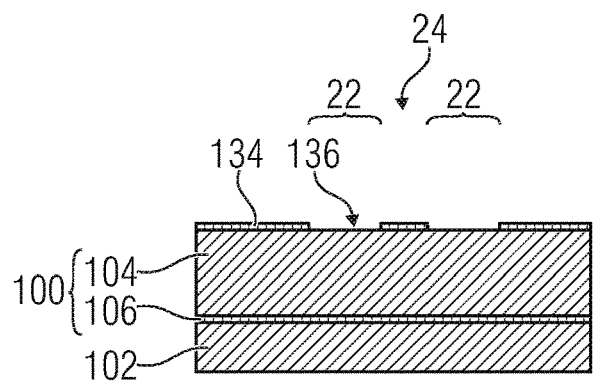
FIGS. 19A-19J each illustrate a spatial representation of results of process steps of a manufacturing method for manufacturing a micromechanical device which corresponds to that of FIG. 16.
Figure 19B:
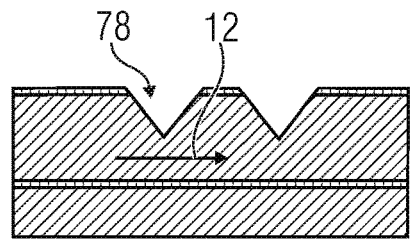

One embodiment for a potential manufacturing of a micromechanical element in accordance with the manner of FIGS. 14 to 17, which corresponds more to that of FIG. 16, will be described below referring to FIGS. 19A to 19J. A BSOI wafer is again exemplary started with. Mutually corresponding layers are provided with the same reference numerals like in FIGS. 18A-18J as far as possible. The process starts, as is shown in FIG. 18A, with the BSOI wafer 100 as a basis and structuring and etching of a hard mask on the exposed side of the semiconductor layer 104. The hard mask 134 is opened at locations 136 which are aligned to the segments 22, while the hard mask 134 remains at the segments 24. The hard mask is provided for future etching of the semiconductor layer 104 so as to form recesses which extend into the layer 104 in segments 22, wherein the recesses are provided with the reference numeral 78 and the result of etching the semiconductor material of the layer 104 is shown in FIG. 19B. Etching may exemplary take place by means of TMAH or KOH. The recesses 78 within the segment 22 are transverse to the direction 12. As has also been described referring to FIG. 16, the topography which is provided for the distal and proximal electrodes is provided in this way.

Figure 19C:
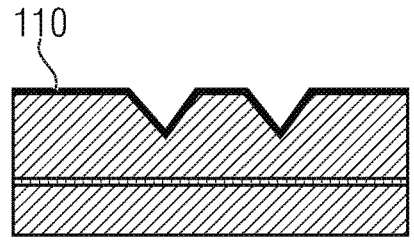

Subsequently, the insulation layer 110 is applied over the entire area, which in turn may take place by depositing a 400 nm $Al_2O_3$ layer by means of ALD, for example. The result is illustrated in FIG. 19C.

Figure 19D:
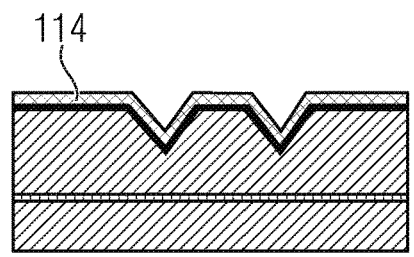
Figure 19E:
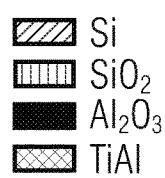
Figure 19E:
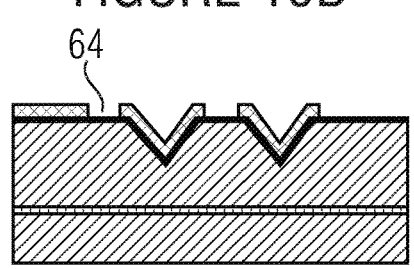

After that, an electrically conductive layer, that is layer 114, which takes the function of the proximal electrode, is deposited onto the insulation layer 110, wherein, after having been deposited over the entire area, the results of which is shown in FIG. 19D, this electrode layer 114 is structured so as to form the insulation windows 64 at the segment boundaries 24 and a feed line to a bond pad and the bond pad itself, as is shown in FIG. 18c. The result after structuring is shown in FIG. 19E. The electrode layer 114 may, for example, be a TiAl electrode and depositing as a 1000 nm layer take place by means of PVD.

Figure 19F:
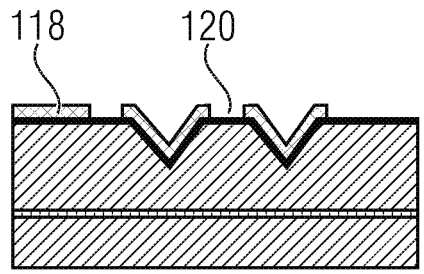

As is shown in FIG. 19F, the sacrificial material is then applied and the sacrificial layer 100 is structured so as to expose the insulation layer 110 within the insulation islands 64 such that the lateral edges of the proximal electrode or its portions 66 are also enclosed. The sacrificial layer 118 in turn may be deposited to be a 200 nm USG layer by means of PE-CVD, for example. An opening region for the bond pad and feed line of the distal electrode, as has been described before referring to FIG. 18F, may be provided by structuring the sacrificial layer 118.

Figure 19G:
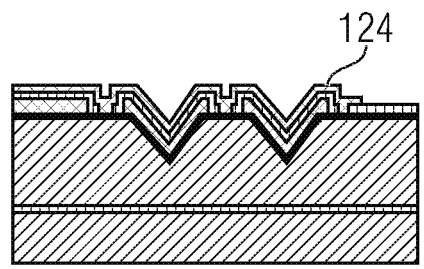

As is shown in FIG. 19G, the distal electrode is applied subsequently, such as, for example, by depositing 500 to 1000 nm of TiAl, by means of PVD, for example. The contour line may be structured, as has been described before.

Figure 19H:
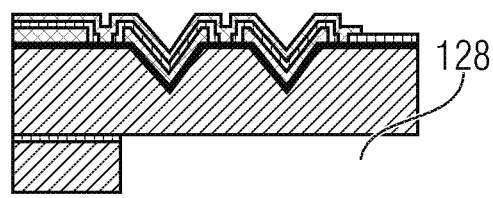
Figure 19I:
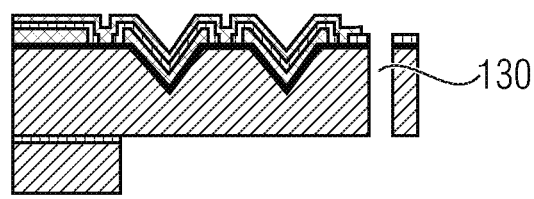
Figure 19J:
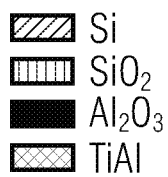
Figure 19J:
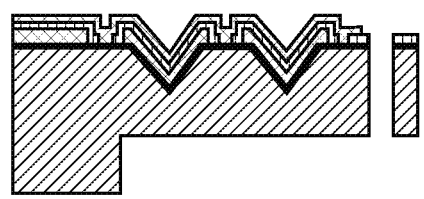

FIGS. 19H and 19J show the result as results after generating the back side recess and after generating the opened trench 130. FIG. 19J in turn shows the result after removing the sacrificial material, and with regard to details of the description of a potential implementation of the steps which result in FIGS. 19H to 19J, the corresponding description of FIGS. 18H to 18J is referred to. It is also pointed out with regard to the above explanations that wherever special materials are mentioned, they are only to be understood to be examples, both separately and in combination. Thus, the semiconductor material for the carrier material 36, that is the semiconductor material 104, only exemplary is silicon, such as, for example, single-crystalline silicon, and other materials than silicon oxide, for example, may be used for the buried insulation layer 106 and the hard mask 134, wherein a different material may be used for the insulation layer 110 and 70, and again a different material than TiAl may be used for the top and bottom electrodes.

With regard to the above embodiments, it is to be mentioned exemplary that the thickness D of the deflectable element 10 may, for example, be more than 20, or even more than 50 times a maximum width of the slot 32 in the thickness direction. The thickness D of the deflectable element 10 may exemplary also be more than 20, or even more than 50 times a thickness of the distal electrode. A mean distance in which segment boundaries are repeated or a mean width of the segments in the segment succession direction 12 may, for example, be smaller than D/2 or even smaller than D/10. Thus, a length of the plate capacitor in the segment succession direction, that is, so to speak, the sum of the width of the segments in the segment succession direction, is, for example, more than 5 times D or even more than 10 times D. The extension or width of the plate capacitor in the longitudinal direction of the segments, that is transverse to the segment succession direction, may, for example, be more than 1 times D, or even more than 5 times D.

With regard to the above embodiments, it is also to be mentioned that continuity of the distal electrodes in the segment succession direction is not compulsory. In all the embodiments, the distal electrode may also be formed to be discontinuous, for example with gaps at the segment boundaries. This applies, as far as the embodiments of FIGS. 1 to 13 described at first are concerned, to the proximal electrode as well. Here, too, the proximal electrode may be formed to be discontinuous, for example with gaps at the segment boundaries. Whenever continuity of the proximal electrode, the distal electrode or the insulation layer in the embodiments 1 to 19J mentioned above is mentioned, what is meant here may, for example, be integrity in cross-section in parallel to the segment succession direction and in parallel to the layer stack direction, that is there is a continuous path in the respective layer in cross-section from one end of the plate capacitor in the segment succession direction to the other end of the plate capacitor. However, continuity here is met already when, relative to the width of the plate capacitor in the segment longitudinal direction, that is transverse to the segment succession direction, it applies to more than 80% of the possible cross-sections in parallel to the segment succession direction and in parallel to the layer stack direction.

Referring to the embodiments of FIGS. 1 to 13, it is pointed out that it is also possible for the insulation layer continuous in the segment succession direction not to abut on the proximal electrode, but the distal electrode. Exemplary, the sacrificial material is at first applied onto a proximal electrode formed continuously in the segment succession direction and then structured so as to define the future slots, wherein afterwards a continuous insulation layer is applied onto which in turn the distal electrode may be applied.

Expressed differently, the above embodiments in accordance with FIGS. 14 to 19J show micromechanical devices with an insulation layer located below the proximal electrode, wherein gaps or insulation windows are formed in the bottom electrode and the top electrode is connected mechanically to the insulation layer and, thus, to the bending beam or membrane via the insulation windows. Alternatively, as has been discussed before referring to FIGS. 1 to 13, the beam or membrane may represent the proximal electrode, wherein an insulation layer is arranged between beam/membrane and distal electrode. Manufacturing methods have been described before. As has already been indicated above, it is also possible for each segment or each portion of the proximal electrode to be drivable individually or separately such that a number of segments of the proximal electrode may be driven in groups, wherein it is also possible for a number of segments of the proximal electrodes to be drivable in groups and the grouping to be selected such that the deflection of the electrostatic actuator is addressable digitally. In this way, fixed states of deflection may be initiated using a selection of a few control lines, such as, for example, 256 states of deflection using 8 control lines.

As has already been described before, the proximal and distal electrodes may, for example, be made from titanal aluminide, doped polysilicon, doped amorphous silicon or aluminum. The insulation layer may, for example, be made from aluminum oxide or thermal silicon oxide. The sacrificial layer which will be removed afterwards may, for example, be made from CVD silicon oxide.

As regards the slot 32 forming by removing the sacrificial material, it is pointed out that this slot may be filled or unfilled. In particular, it may represent an air gap between the electrodes.

However, it is also pointed out that, in contrast to what has been illustrated above, different materials may be used for manufacturing a micromechanical device in accordance with any of FIGS. 1 to 19F, such as, for example, a polymer, FR4 or the like. Different manufacturing methods, not relating to microsystem technology, may also be used, such as, for example, roll-to-roll manufacturing method on films (such as, for example, made of polymer) or technologies of circuit board manufacturing (FR4).

As has also been described before, it is possible to locally change the thickness of the deflectable element. The goal here may be to locally modify the bending strength and, thus, a change in the local actuating change in curvature of the deflectable element. A desired deforming profile of the deflectable element may be changed or specifically set by this. The deflectable element may, as already mentioned, be a beam or an entire plate, such as, for example, a deformable mirror having a parametrizable surface topography.

It has also been mentioned already that further electrodes may be introduced which may exemplary be provided to be a conductive thin layer on the fixed frame surrounding the bending beam or deflectable element, for specifically influencing the actuating excitation by means of parasitic electrostatic fields, such as, for example, the field between the distal/proximal electrodes and the fixed frame. Such an electrode may also be formed on the insulation layer on the side opposite the deflectable element across the trench 130.

It is also to be pointed out that the slot 32 may be protected by a passivation, such as, for example, against dust, humidity or other environmental influences. This may, for example, be realized by a thin and elastic layer, such as, for example, a sputtered resist, wherein it is additionally pointed out that the slot 32 may be filled partly or completely with something different from air, such as, for example, with a dielectric elastic material, such as, for example, a polymer. The goal of this filling may exemplary be changing the electrical behavior, such as, for example, reducing tunnel currents or electrical breakthrough, and protection from dust, humidity and other environmental influences.

It is additionally pointed out that micromechanical devices described before may be provided with a sensor. Such a sensor may exemplary be indicated by a capacitive sensor, a piezoelectrical, piezostrictive, piezoresistive or magnetoresistive sensor. Structures of the type mentioned before may also be stacked onto one another. The actuating path or actuating force might be increased by this.

Above embodiments may also be employed in rainbow actuators in accordance with the type of U.S. Pat. No. 5,471,721 shown in FIG. 18, for example.

The above embodiments of micromechanical devices may also be employed in micro loudspeakers or in MEMS loudspeakers, or in resonators for timers or clocks, that is as an MEMS clock. Above micromechanical devices may also be employed for moving the peak in a scanning near field optical microscope (SNOM). Using the SNOM technology would also be conceivable for product protection, namely by specifically introducing a very small pattern on the product. The micromechanical devices described before may also be employed for switching on/off individual pixels in a display, such as, for example, in a "telescopic pixel display". By means of their electrostatic actuators, above micromechanical devices can produce an expansion, rotation in the case of being used as an arch drive, and as an actuator for changing the volume, such as, for example, as a ring-shaped actuator changing its cross-section, as a membrane pump or valve or exemplary as a micro pump in microfluidic applications, like, for example, for being used within a lab-on chip. The above micromechanical devices may, for example, also be used for weighing or sorting particles, such as, for example, for fine dust analysis or for electrophoresis.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A micromechanical device comprising:
a deflectable element, wherein the deflectable element comprises:
an electrostatic actuator which is implemented as a plate capacitor extending along and spaced apart in a deflection direction from a neutral fiber of the deflectable element,
the capacitor comprising a distal electrode and a proximal electrode, wherein the proximal electrode is arranged between the distal electrode and the neutral fiber and the plate capacitor is subdivided along a direction into segments between which the distal electrode is fixed mechanically at segment boundaries such that the deflectable element, by providing the plate capacitor with a voltage, is deflected along the direction in or opposite to the deflection direction; and
wherein the proximal electrode is arranged at a side of an insulation material of the deflectable element facing the distal electrode and is structured along the direction so as to comprise gaps at the segment boundaries such that the distal electrode is mounted mechanically to the insulation material at the segment boundaries in a manner laterally spaced apart from the proximal electrode.

2. The micromechanical device in accordance with claim 1, wherein the distal electrode is formed to be continuous in the direction across the segments and segment boundaries.

3. The micromechanical device in accordance with claim 1, wherein the side of the insulation material facing the distal electrode is implemented to be planar.

4. The micromechanical device in accordance with claim 1, wherein the proximal electrode comprises one portion per segment, wherein the portions are spaced apart from one another at the segment boundaries via the gaps, wherein the portions, at a side facing the distal electrode, due to a multi-layered setup, comprise a side facing the distal electrode and facing away from the insulation material, which comprises a non-planar shape.

5. The micromechanical device in accordance with claim 4, wherein the deflectable element comprises a beam or membrane through which passes the neutral fiber, wherein the insulation material is formed by an insulation layer which is arranged at a side of the beam or membrane facing the distal electrode.

6. The micromechanical device in accordance with claim 5, wherein the insulation layer is a conformingly deposited insulation layer of basically constant thickness.

7. The micromechanical device in accordance with claim 4, wherein the proximal electrode or the distal electrode is electrically short-circuited to the beam or membrane.

8. The micromechanical device in accordance with claim 3, wherein the portions of the proximal electrode are short-circuited to one another to be placed at a common potential, are drivable individually to be placed at mutually different potentials, are short-circuited in groups to be set in groups to different potentials.

9. A micromechanical device comprising:
a deflectable element, wherein the deflectable element comprises:
an electrostatic actuator which is implemented as a plate capacitor extending along and spaced apart in a direction of deflection from a neutral fiber of the delectable element, the capacitor comprising a distal and a proximal electrode,
wherein the distal electrode is arranged on a side of the place capacitor facing away from the neutral fiber and the place capacitor is subdivided along a direction into segments between which the distal electrode and the proximal electrode are connected mechanically at segment boundaries such that, by providing the plate capacitor with a voltage, the deflectable element is deflected along the direction in or opposite to the direction of deflection, and wherein an insulation layer extends between the distal electrode and the proximal electrode in a manner formed continuously in the direction across the segments and segment boundaries so as to insulate same from one another such that mechanical coupling at the segment boundary is realized indirectly via the insulation layer.

10. The micromechanical device in accordance with claim 9, wherein the proximal electrode and the distal electrode are formed continuously in the direction across the segments and segment boundaries.

11. The micromechanical device in accordance with claim 9, wherein the insulation layer abuts on the proximal electrode.

12. The micromechanical device in accordance with claim 9, wherein the deflectable element comprises a beam or membrane through which passes the neutral fiber, wherein the beam or membrane abuts on the insulation layer at a side facing the distal electrode and serves itself as the proximal electrode.

13. The micromechanical device in accordance with claim 9, wherein a side of the proximal electrode facing the distal electrode is implemented to be planar and the insulation layer is a planar layer abutting thereon, wherein slots of the plate capacitor between the proximal and distal electrodes in the segments result from a deviation, repeating per segment, of the distal electrode from a planar shape extending in parallel to the insulation layer.

14. The micromechanical device in accordance with claim 9, wherein a side of the proximal electrode facing the distal electrode comprises one recess or projection extending transverse to the direction per segment and the insulation layer is a planar conforming layer abutting on the side of the proximal electrode facing the distal electrode.

15. The micromechanical device in accordance with claim 14, wherein slots of the plate capacitor between the proximal and distal electrodes in the segments comprise an essentially constant thickness.

16. The micromechanical device in accordance with claim 1, wherein the distal and/or proximal electrode(s) is/are formed from titanal aluminide, doped polysilicon, doped amorphous silicon or aluminum.

17. The micromechanical device in accordance with claim 1, wherein the insulation layer is formed from aluminum oxide or thermal silicon oxide.

18. The micromechanical device in accordance with claim 1, wherein a width of a slot between the distal and proximal electrodes within the segments is basically constant.

19. The micromechanical device in accordance with claim 1, wherein a slot between the distal electrode and the proximal electrode within the segments comprises a cross-sectional profile which is equal among the segments.

20. The micromechanical device in accordance with claim 19, wherein the profile comprises a cross-section arched in the direction of the neutral fiber or away from the neutral fiber or a pointed cross-section.

21. The micromechanical device in accordance with claim 1, wherein the deflectable element is formed from a semiconductor material, metal, plastic, polymer or FR4.

22. The micromechanical device in accordance with claim 1, wherein a thickness of the deflectable element in a direction of curvature into which the deflectable element is curved by providing the plate capacitor with a voltage is larger by more than 5 times a thickness of the distal electrode and a thickness of a slot between the distal and proximal electrodes in the segments together.

23. The micromechanical device in accordance with claim 9, wherein a thickness of the deflectable element in a direction of curvature into which the deflectable element is curved by providing the plate capacitor with a voltage is larger by more than 5 times a thickness of the distal electrode and a thickness of a slot between the distal and proximal electrodes in the segments together.

24. The micromechanical device in accordance with claim 1, wherein the deflectable element is implemented to be a membrane or beam.

25. The micromechanical device in accordance with claim 1, wherein a thickness of the deflectable element, measured in a direction of curvature into which the deflectable element is curved by providing the plate capacitor with a voltage, is varied along the direction such that the degree of deflection also varies along the direction.

26. The micromechanical device in accordance with claim 1, wherein a slot between the distal and proximal electrodes transverse to the direction and transverse to a direction of curvature into which the deflectable element is curved by providing the plate capacitor with a voltage, within the segments, is closed.

27. The micromechanical device in accordance with claim 1, wherein a slot between the distal and proximal electrodes within the segments is filled by air, polymer, a dielectric elastic material.

28. A method for operating a micromechanical device in accordance with claim 1.

29. A method for operating a micromechanical device in accordance with claim 9.

30. A micromechanical device comprising a deflectable element, wherein the deflectable element comprises an electrostatic actuator which is implemented as a plate capacitor extending along and spaced apart in a deflection direction from a neutral fiber of the deflectable element, the capacitor comprising a distal electrode and a proximal electrode, wherein the proximal electrode is arranged between the distal electrode and the neutral fiber and the plate capacitor is subdivided along a direction into segments between which the distal electrode is fixed mechanically at segment boundaries such that the deflectable element, by providing the plate capacitor with a voltage, a lateral expansion or a lateral tension is induced by the plate capacitor in the deflectable element which deflects the deflectable element according to the bimorph principle along the direction in or opposite to the deflection direction;

wherein the proximal electrode is arranged at a side of an insulation material of the deflectable element facing the distal electrode and is structured along the direction so as to comprise gaps at the segment boundaries such that the distal electrode is mounted mechanically to the insulation material at the segment boundaries in a manner laterally spaced apart from the proximal electrode.

31. A micromechanical device comprising a deflectable element, wherein the deflectable element comprises an electrostatic actuator which is implemented as a plate capacitor extending along and spaced apart in a deflection direction from a neutral fiber of the deflectable element, the capacitor comprising a distal electrode and a proximal electrode, wherein the proximal electrode is arranged between the distal electrode and the neutral fiber and the plate capacitor is subdivided along a direction into segments between which the distal electrode is fixed mechanically at segment boundaries such that the deflectable element, by providing the plate capacitor with a voltage, is deflected along the direction in or opposite to the deflection direction, wherein:

the proximal electrode is arranged at a side of an insulation material of the deflectable element facing the distal electrode and is structured along the direction so as to comprise gaps at the segment boundaries such that the distal electrode is mounted mechanically to the insulation material at the segment boundaries in a manner laterally spaced apart from the proximal electrode, wherein the proximal electrode comprises one portion per segment, wherein the portions are spaced apart from one another at the segment boundaries via the gaps and wherein the portions of the proximal electrode are short-circuited to one another to be placed at a first common potential so that the proximal electrode is at the first common potential across the segments and segment boundaries, and the distal electrode is formed to be continuous in the direction across the segments and segment boundaries so that the distal electrode is at a second common potential across the segments and segment boundaries.

32. A micromechanical device comprising a deflectable element, wherein the deflectable element comprises an electrostatic actuator which is implemented as a plate capacitor extending along and spaced apart in a direction of deflection from a neutral fiber of the delectable element, the capacitor comprising a distal and a proximal electrode, wherein the distal electrode is arranged on a side of the place capacitor facing away from the neutral fiber and the place capacitor is subdivided along a direction into segments between which the distal electrode and the proximal electrode are connected mechanically at segment boundaries such that, by providing the plate capacitor with a voltage, a lateral expansion or a lateral tension is induced by the plate capacitor in the deflectable element which deflects the deflectable element according to the bimorph principle along the direction in or opposite to the direction of deflection, wherein:

an insulation layer extends between the distal electrode and the proximal electrode in a manner formed continuously in the direction across the segments and segment boundaries so as to insulate same from one another such that mechanical coupling at the segment boundary is realized indirectly via the insulation layer.

33. A micromechanical device comprising a deflectable element, wherein the deflectable element comprises an electrostatic actuator which is implemented as a plate capacitor extending along and spaced apart in a direction of deflection from a neutral fiber of the delectable element, the capacitor comprising a distal and a proximal electrode, wherein the distal electrode is arranged on a side of the place capacitor facing away from the neutral fiber and the place capacitor is subdivided along a direction into segments between which the distal electrode and the proximal electrode are connected mechanically at segment boundaries such that, by providing the plate capacitor with a voltage, the deflectable element is deflected along the direction in or opposite to the direction of deflection, wherein:

an insulation layer extends between the distal electrode and the proximal electrode in a manner formed continuously in the direction across the segments and segment boundaries so as to insulate same from one another such that mechanical coupling at the segment boundary is realized indirectly via the insulation layer, and between the segment boundaries a gap is arranged between the proximal electrode and the distal electrode at each segment in addition to the insulation layer, and the proximal electrode is formed to be continuous in the direction across the segments and segment boundaries so that the proximal electrode is at a first common potential across the segments and segment boundaries, and the distal electrode is formed to be continuous in the direction across the segments and segment boundaries so that the distal electrode is at a second common potential across the segments and segment boundaries.

* * * * *